US012523933B2

(12) United States Patent
Eden et al.

(10) Patent No.: US 12,523,933 B2
(45) Date of Patent: Jan. 13, 2026

(54) PHOTORESIST-FREE PHOTOLITHOGRAPHY, PHOTOPROCESSING TOOLS, AND METHODS WITH VUV OR DEEP-UV LAMPS

(71) Applicant: The Board of Trustees of the University of Illinois, Urbana, IL (US)

(72) Inventors: James Gary Eden, Champaign, IL (US); Dane Sievers, Fisher, IL (US); Andrey Mironov, Urbana, IL (US); Jinhong Kim, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 1126 days.

(21) Appl. No.: 17/268,276

(22) PCT Filed: Aug. 13, 2019

(86) PCT No.: PCT/US2019/046367
§ 371 (c)(1),
(2) Date: Feb. 12, 2021

(87) PCT Pub. No.: WO2020/036971
PCT Pub. Date: Feb. 20, 2020

(65) Prior Publication Data
US 2021/0333711 A1 Oct. 28, 2021

Related U.S. Application Data

(60) Provisional application No. 62/746,797, filed on Oct. 17, 2018, provisional application No. 62/718,421, filed on Aug. 14, 2018.

(51) Int. Cl.
G03F 7/039 (2006.01)
G03F 7/20 (2006.01)

(52) U.S. Cl.
CPC ............ G03F 7/039 (2013.01); G03F 7/2004 (2013.01); G03F 7/203 (2013.01)

(58) Field of Classification Search
CPC ........ G03F 7/2004; G03F 7/201; G03F 7/203; G03F 7/039
See application file for complete search history.

(56) References Cited

U.S. PATENT DOCUMENTS

| 4,532,427 A | 7/1985 | Matthews et al. |
| 4,617,085 A * | 10/1986 | Cole, Jr. ............. H01L 21/4803 219/121.85 |
| 7,684,014 B2 | 3/2010 | Sewell et al. |
| 8,758,974 B2 | 6/2014 | Soper et al. |
| 2004/0191703 A1 | 9/2004 | Soper et al. |
| 2007/0240986 A1* | 10/2007 | Reymond ............. C12Q 1/001 29/746 |
| 2012/0255932 A1 | 10/2012 | Tabib-Azar et al. |
| 2012/0274004 A1 | 11/2012 | Kobrin |
| 2014/0265036 A1 | 9/2014 | Eden et al. |
| 2017/0299960 A1* | 10/2017 | Parker .................. G03F 7/2004 |
| 2018/0099257 A1 | 4/2018 | Eden et al. |
| 2021/0333711 A1 | 10/2021 | Eden et al. |

FOREIGN PATENT DOCUMENTS

WO 2020236518 A1 11/2020

OTHER PUBLICATIONS

Partial Supplementary European Search Report from the corresponding International Patent Application No. PCT/US2019/046367, dated May 31, 2022.
Written Opinion of the International Searching Authority on the corresponding International Patent Application No. PCT/US2019/046367, dated Nov. 25, 2019.
International Search Report and Written Opinion from the corresponding International Patent Application No. PCT/US2019/046367, dated Nov. 25, 2019.
Asakura et al., "A simple lithographic method employing 172 nm vacuum ultraviolet light to prepare positive- and negative-tone poly(methyl methacrylate) patterns", Thin Solid Films, 2006, pp. 237-240, vol. 500, Elsevier B.V. . . .
Dölle et al., "Gradual Photochemical-Induced Conversion of Liquid Polydimethylsiloxane Layers to Carbon Containing Silica Coatings by VUV Irradiation at 172 nm", Langmuir, 2009, pp. 7129-7134, vol. 25, No. 12, American Chemical Society.

(Continued)

*Primary Examiner* — Daborah Chacko-Davis
(74) *Attorney, Agent, or Firm* — Greer, Burns & Crain, Ltd.; Steven P. Fallon

(57) ABSTRACT

A fabrication tool has at least one flat lamp photon source, or an array of flat lamps, that serve to non-thermally ablate polymer material from a surface. No photoresist is required and the desired photoablated pattern is determined by inserting a photolithographic mask between the lamp(s) and the surface to be processed. Methods of the invention pattern organic polymer and can pattern a substrate using a pattern established in an organic polymer layer on the substrate, and can also deposit materials in the pattern by breaking bonds in deposition precursors with photons from the microplasma array. Another method converts organic polymer material to have a hydrophylic surface. A tool of the invention can have width and depth comparable to a typical paperback book and a height comparable to a coffee cup.

20 Claims, 28 Drawing Sheets

(56) References Cited

OTHER PUBLICATIONS

Gan et al., "Fabrication of cell pattern on poly(dimethylsiloxane) by vacuum ultraviolet lithography", Colloids and Surfaces B: Biointerfaces, 2010, pp. 381-385, vol. 76, Elsevier B.V. . . .
Cefalas et al., "Absorbance and outgasing of photoresist polymeric materials for UV lithography below 193 nm including 157 nm lithography", Microelectronic Engineering, 200, pp. 123-126, vol. 53, Elsevier Science B.V. . . .
Maezano et al., "Study of Refractive Index Change in Ge-Doped Fibers with Vacuum Ultraviolet Light Irradiation", Japanese Journal of Applied Physics, 2008, pp. 7266-7268, vol. 47, No. 9, The Japan Society of Applied Physics.
Hamamoto et al., "Cleaning of extreme ultraviolet lithography optics and masks using 13.5 nm and 172 nm radiation", Journal of Vacuum Science & Technology B: Microelectronics and Nanometer Structures Processing, Measurement, and Phenomena, 2005, pp. 247-251, vol. 23, No. 1, American Vacuum Society.
Yamaguchi et al., "A Study of Photoresist Pattern Freezing for Double Imaging using 172nm VUV Flood Exposure", Journal of Photopolymer Science and Technology, 2008, pp. 697-704, vol. 21, No. 5, The Society of Photopolymer Science and Technology.
Park et al., "25 W of average power at 172 nm in the vacuum ultraviolet from flat, efficient lamps driven by interlaced arrays of microcavity plasmas", APL Photonics, 2017, pp. 1-7, vol. 2, No. 041302, AIP Publishing.

\* cited by examiner

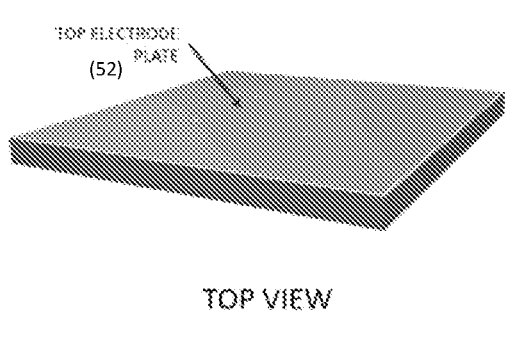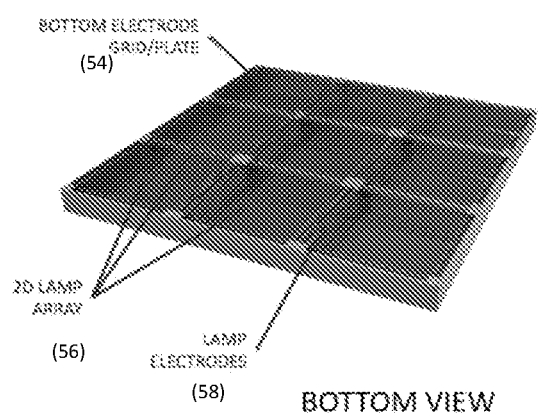
FIG. 8A
FIG. 8B

TOP

TOP

SIDE

ISO

BOTTOM

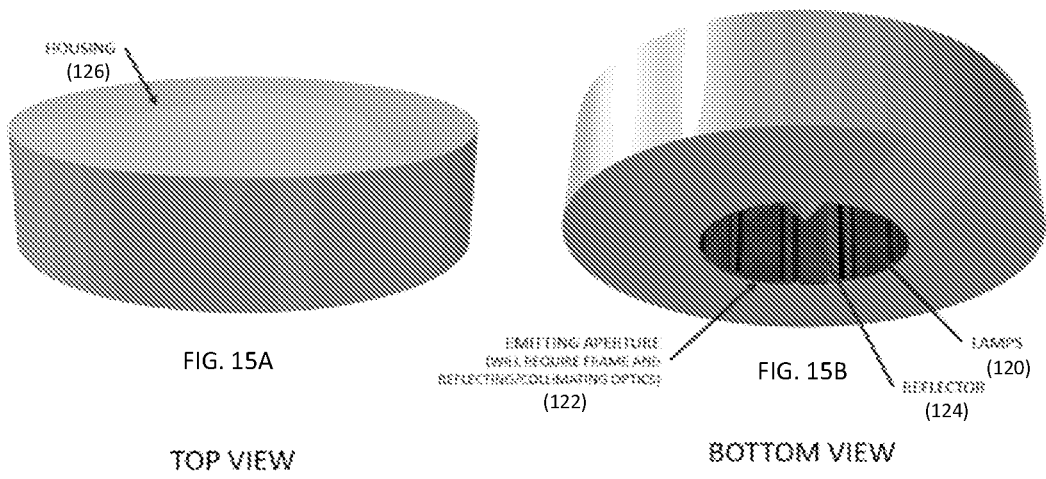
FIG. 15A TOP VIEW
FIG. 15B BOTTOM VIEW

TOP VIEW
COVER REMOVED

TOP VIEW
OUTER HOUSING REMOVED

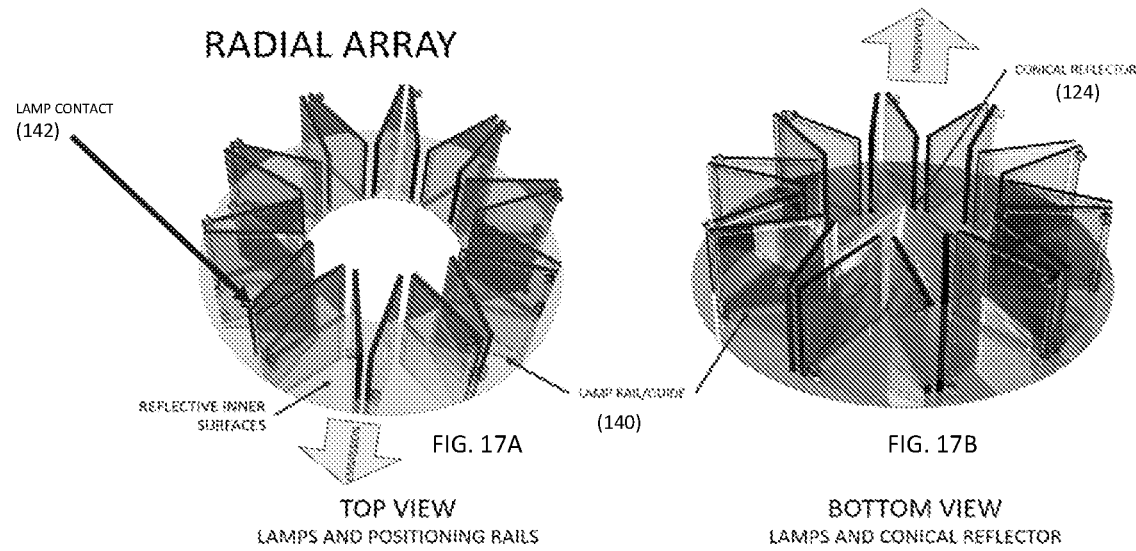

RADIAL ARRAY

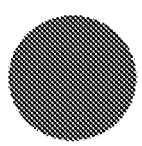
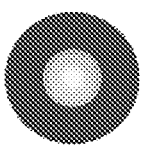
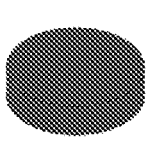
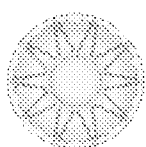
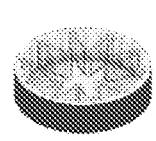
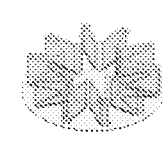

LAMP ASSEMBLY TOP
FIG. 18A

LAMP ASSEMBLY BOTTOM
FIG. 18B

SIDE
FIG. 18C

LAMP ASSEMBLY TOP ISO
FIG. 18D

LAMP ASSEMBLY TOP INTERIOR
FIG. 18E

LAMP ASSEMBLY BOTTOM INTERIOR ISO
FIG. 18F

LAMP ASSEMBLY BOTTOM INTERIOR ISO 2
FIG. 18G

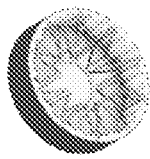
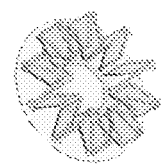
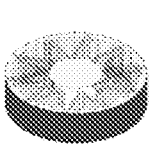
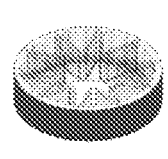
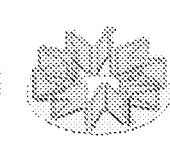

LAMP ASSEMBLY BOTTOM ISO
FIG. 18H

LAMP ASSEMBLY BOTTOM ELECTRODES ISO
FIG. 18I

LAMP ASSEMBLY BOTTOM INTERIOR ISO
FIG. 18J

LAMP ASSEMBLY TOP INTERIOR ISO
FIG. 18K

LAMP ASSEMBLY TOP INTERIOR NO REFLECTOR ISO
FIG. 18L

LAMP ASSEMBLY TOP INTERIOR NO REFLECTOR ISO 2
FIG. 18M

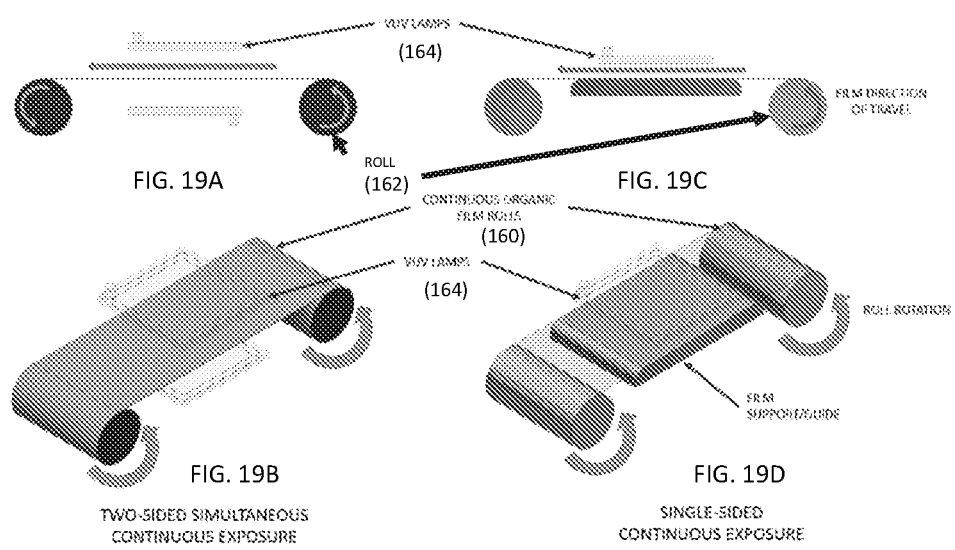

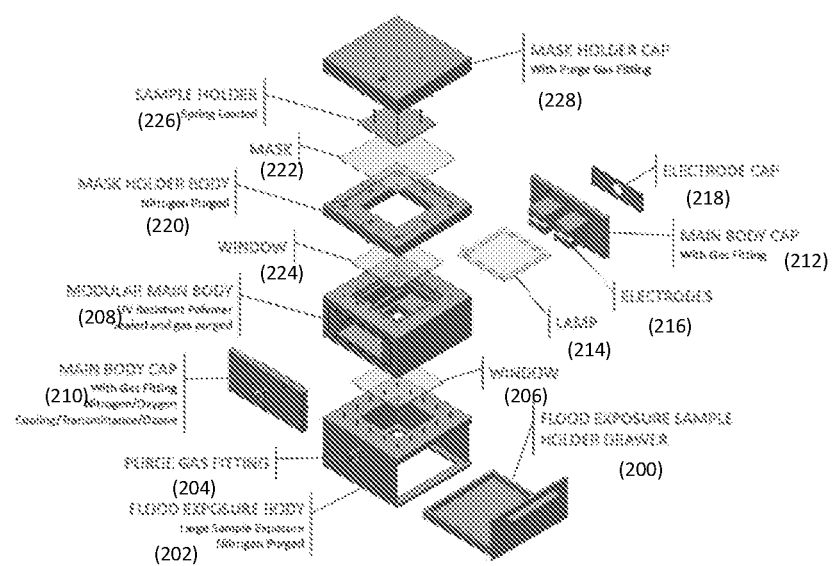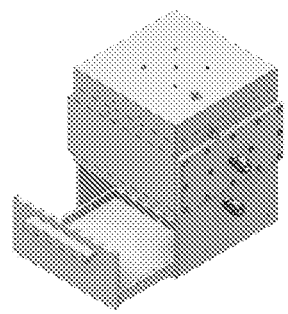
FIG. 23A
FIG. 23B

PHOTORESIST-FREE PHOTOLITHOGRAPHY, PHOTOPROCESSING TOOLS, AND METHODS WITH VUV OR DEEP-UV LAMPS

PRIORITY CLAIM AND REFERENCE TO RELATED APPLICATION

The application claims priority under 35 U.S.C. § 119 and all applicable statutes and treaties from prior U.S. provisional application Ser. No. 62/718,421, which was filed Aug. 14, 2018 and from U.S. provisional application Ser. No. 62/746,797, which was filed Oct. 17, 2018.

STATEMENT OF GOVERNMENT INTEREST

This invention was made with government support under grant numbers FA9550-14-1-0002 and FA9550-18-1-0380, awarded by the U.S. Air Force Office of Scientific Research. The government has certain rights in the invention.

FIELD

Fields of the invention include photolithography and photo-processing of thin films and bulk materials, including the patterning, etching, and deposition of materials. Applications of the invention include the design and fabrication of optical, semiconductor electronic, and biomedical devices and components as well as integrated optical, electronic, and biomedical systems.

BACKGROUND

Current semiconductor fabrication processes for electronic and photonic devices are serial in the sense that each step (photolithography, etching, deposition, "ashing", etc.) often requires a separate tool. For example, an excimer laser (ArF, KrF) stepper (step-and-repeat projection aligner) is currently the common tool for photolithographic processes, whereas the typical tool for etching material patterned by photolithography is a plasma system.

The transport of electronic devices between multiple tools during complex fabrication sequences for semiconductor electronic devices, which often require many photolithographic, etching, and film deposition steps, not only slows the manufacturing process but also dramatically raises manufacturing costs. The defect rate is also affected by the repeated transfer between different tools. As one increases the number of times that a semiconductor wafer is transferred from one processing tool to the next, the probability of damaging devices on the wafer rises.

Virtually all existing photolithography methods require the use of a photoresist for the purpose of defining a pattern on a material surface that is to be processed by any of several micro- or nano-scale fabrication processes such as etching, thin-film deposition, electroplating, and ashing. The manufacture of electronic and photonic devices often requires multiple photolithographic steps during the overall processing sequence, and each of these steps entails: 1) applying a film of photoresist uniformly to the surface; 2) exposing the photoresist to deep-ultraviolet (UV) or vacuum ultraviolet (VUV) radiation ("light") according to a predetermined pattern, and 3) after the desired processing of the surface (deposition, etching, etc.) is completed, removing the photoresist before proceeding onto the next processing step. The latter requirement for removing the photoresist is generally accomplished through wet chemistry with a solvent. Consequently, large volumes of solvents must be either disposed of, or recycled, in an approved manner. In short, the need for a photoresist at any step in the fabrication of photonic, electronic, or biomedical devices imposes a financial and environmental burden on the manufacturer, the consumer, and the public. The elimination of one or more photoresists from the overall processing sequence, therefore, is desirable.

Recent developments provide thin, flat lamps emitting at 172 nm (and other wavelengths in the VUV [100-200 nm] and UV [200-400 nm] regions of the spectrum) that are now available commercially and generate intensities above 150 $mW/cm^2$. Furthermore, these lamps offer "wall-plug" efficiencies beyond 20%. Several of the characteristics of these lamps have been described in S.-J. Park et al., "25 W of Average Power at 172 nm in the Vacuum Ultraviolet from Flat, Efficient Lamps Driven by Interlaced Arrays of Microcavity Plasmas," APL Photonics, vol. 2, 041302 (2017). Although 172 nm-emitting lamps have been available for decades, previous lamps were cylindrical and produced only low intensities (typically less than 50 $mW/cm^2$). Also, the flat form-factor of these microplasma array-driven lamps allows for them to be "tiled"—mounted in a common frame, for example, that allows for uniform time-averaged, and instantaneous (peak), intensities greater than 1 kW/m2 and up to and beyond 1 $kW/cm^2$, respectively, to be readily produced at a flat surface. Cylindrical lamps or bulbs, on the other hand, often require VUV or UV optics located behind the lamp. Such optics are generally reflective and serve the dual purpose of: 1) capturing light that has exited the rear portion of the cylindrical lamp, and 2) directing as much of the lamp's output as possible to a flat surface for the purpose of uniformly illuminating that surface. Unfortunately, VUV reflecting optics, in particular, are expensive, degrade quickly because of the formation of color centers (light-absorbing defects) in the reflector, and require alignment. If coverage of a surface area larger than that accessible with a single lamp is desired, overlapping the radiation from adjacent, parallel lamps so as to produce a uniform intensity over an entire surface is demanding. It should be mentioned that the phrase "Deep-UV" is used here to refer to that spectral region in which the radiation wavelength is between approximately 200 nm and 250 nm. As noted earlier, the entire UV region is generally regarded as covering the 200-400 nm region and the VUV spectral region extends from 100 nm to 200 nm. Several flat lamps emitting at wavelengths longer than 250 nm will be mentioned here but these all generate UV radiation.

In 2006, Asakura et al. [1] eroded a PMMA film with 172 nm radiation that also illuminated the substrate. Removing the film required a pressure of 1000 Pa (approximately 0.8 Torr) of room air in the chamber for the process to occur. Thus, approximately 0.2 Torr of oxygen ($O_2$) was present in the chamber, and it is well-known that 172 nm photons are efficient in converting $O_2$ into ozone ($O_3$). Consequently, ozone is responsible for the results of Asakura, as the authors acknowledge in the article (attributing film erosion to "activated oxygen"). This severely limits the applicability of the process, and does not permit multiple steps to occur in a single tool, or continuous processing under vacuum.

REFERENCES

[1] S. Asakura, A. Hozumi, T. Yamaguchi, and A. Fuwa, Thin Solid Films 500, 237 (2006).
[2] C. Dölle, M. Papmeyer, M. Ott, K. Vissing, Langmuir 25, 7129 (2009).

[3] H. Sewell, D. McCafferty, and L. J. Markoya, U.S. Pat. No. 7,684,014 (Mar. 23, 2010)

[4] J. Gan, H. Chen, F. Zhou, H. Huang, J. Zheng, W. Song, L. Yuan, and Z. Wu, Colloids and Surfaces B: Biointerfaces 76, 381 (2010).

[5] A. C. Cefalas, E. Sarantopoulou, E. Gogolides, P. Argitis, Microelectronic Engr. 53, 123 (2000).

[6] Y. Maezono, Y. Iwasa, M. Wasamotol, I. Yamamoto, M. Katto, and A. i Yokotani, Japan. J. Appl. Phys. 47, 7266 (2008).

[7] K. Hamamoto, Y. Tanaka, T. Watanabe, N. Sakaya, M. Hosoya, T. Shoki, H. Hada, N. Hishinuma, H. Sugahara, and H. Kinoshita, J. Vac. Sci. Technol. B 23, 247 (2005).

[8] M. Yamaguchi, T. Wallow, Y. Yamada, R.-H. Kim, J. Kye, H. J. Levinson, "A Study of Photoresist Pattern Freezing for Double Imaging using 172 nm VUV Flood Exposure", Proc. 25th Int. Conf. Photopolymer Sci. Technol. (ICPST-25, 2008).

[9] J. G. Eden, Photochemical Vapor Deposition (Wiley & Sons, 1992).

SUMMARY OF THE INVENTION

A preferred embodiment fabrication tool has at least one flat lamp photon source, or an array of flat lamps, that serve to non-thermally ablate polymer material from a surface. No photoresist is required and the desired photoablated pattern is determined by inserting a photolithographic mask between the lamp(s) and the surface to be processed. Either a contact mask or projection system can be employed, and optical components such as Fresnel lenses, gratings, and phase masks can be fabricated directly into a polymer film, thin plate, or bulk material. Intricate and multilayer networks with nanoscale features, and suitable for electronic, photonic, or biomedical applications, are photomachined into any of a variety of polymers by employing one or more masks and multiple exposures of a polymer surface. Patterns fabricated into polymer films or thin layers can be replicated in metal, ceramics, or other materials by overcoating the pattern formed in the polymer and subsequently removing the underlying polymer by wet chemistry or dry etching. Hydrophilic polymer surfaces are fabricated by these processes, allowing for anti-fogging (non-scattering) surfaces to be produced on eyeglasses, goggles, and camera lens surfaces. Watermarks and other information can be "encoded" into polymer films, and "read" only by processing with a liquid such as acetone or alcohol. Multiple processing of a semiconductor or other material, including photolithography, film etching or deposition, can be accomplished in the same processing chamber without the need for a photoresist.

BRIEF DESCRIPTION OF THE DRAWINGS

FIGS. 8A and 8B are, respectively, top and bottom perspective views of a preferred, square lamp photon source for a fabrication tool of the invention;

FIGS. 15A-18M are diagrams of a preferred embodiment radial lamp photon source for a fabrication tool of the invention;

FIG. 19A-D are diagrams illustrating roll-to-roll fabrication in accordance with a preferred method of the invention;

FIGS. 23A and 23B are exploded and perspective diagrams of a preferred compact fabrication tool of the invention well-suited for laboratory and small-scale industrial applications;

In FIG. 28A, the tilted polymer plate in the imaging beam path has been treated with 172 nm lamp radiation for 30 seconds, thereby rendering the polymer plate surface facing the water vapor hydrophilic. In FIG. 28B, the plate has not been treated with VUV radiation and the image is completely obscured by the condensation of water droplets on the plate.

DETAILED DESCRIPTION OF THE PREFERRED EMBODIMENTS

Figure 1:
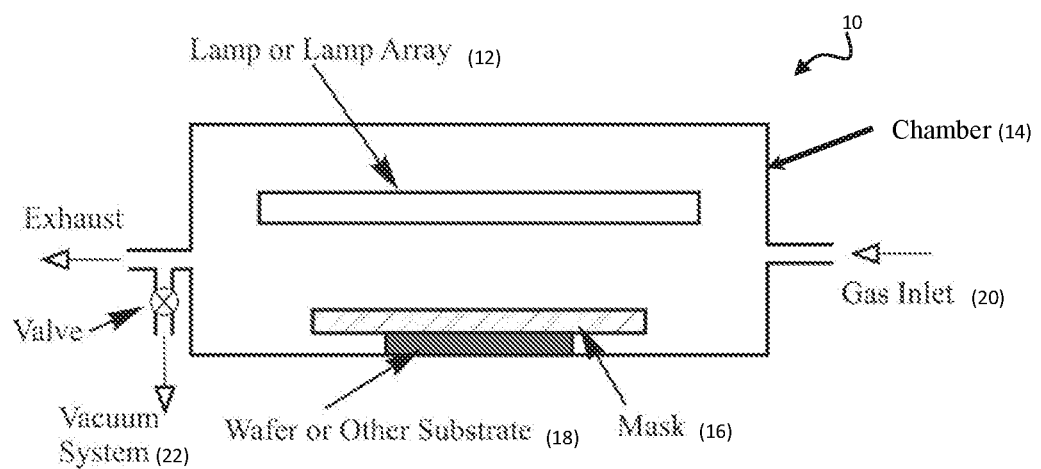
FIG. 1 is a schematic diagram (in cross section, not to scale) of a preferred embodiment fabrication tool having a flat lamp, VUV/UV photon source, or an array of flat lamps as photon sources, which irradiates a wafer or other substrate through a photomask.

A fabrication tool and manufacturing methods of the invention combine photolithography and material photoablation (removal) in a single chamber (tool). No transfer is required between processing tools performing multiple photolithographic and material removal or deposition steps. Preferred fabrication tools utilize efficient, flat vacuum ultraviolet (VUV)/ultraviolet (UV) lamps to perform two or more fabrication processes in the same chamber (tool), a capability that is expected to significantly lower the cost of manufacturing electronic devices.

Preferred fabrication tools and methods further provide photolithographic processes that do not require chemical processing of a photoresist in a separate tool or by wet chemical processing. Preferred tools and methods lower the cost of photolithography and make sub-200 nm resolution photolithography accessible to a broader community of users (primarily universities and small companies). Broader accessibility to sub-200 nm photolithography is a result of a significant reduction in the cost of the tool and, as compared to the commercial processes and photolithographic systems currently in use by large commercial semiconductor manufacturers of microprocessors, DRAM, and other electronic "chips".

Preferred fabrication tools and methods use a flat lamp as a photon source during lithography. The flat lamp photon source can be in close proximity to, or within, a processing chamber. This is not possible at present with laser or XUV lithography. Furthermore, the cost of the flat lamp photon source is at least an order of magnitude lower than that of existing laser photon sources most often employed in commercial fabrication processes. When the flat lamp photon source is integrated into the processing chamber or is in close proximity to the chamber (separated only by a VUV/UV transmitting window), the function provided by the lamp depends solely on the lamp wavelength(s) and the combination of gases and vapors introduced to the chamber. For example, the introduction of carbon tetrachloride ($CCl_4$) vapor into the chamber will cause the lamp radiation to photodissociate the molecule so as to yield chlorine (Cl) atoms that will etch exposed portions of the semiconductor wafer (substrate). Introducing other precursors into the chamber creates different processes. For example, the illumination of trimethylaluminum (TMA) vapor with a lamp emitting wavelengths below approximately 220 nm results in the deposition of aluminum atoms onto exposed portions of a wafer. Importantly, preferred fabrication tools and methods alter conventional photolithographic processes for manufacturing micro- and nano-electronic devices, by enabling etching and deposition to be performed within the same chamber with the same tool.

Preferred fabrication tools and methods use a flat, microplasma-driven lamp as the photon source during lithography, and a lamp configuration system offering different arrangements of individual square or other geometry microplasma lamps so as to provide uniform illumination of large areas on a semiconductor wafer or any flat surface. These arrangements, including "dome" configurations, can be used in conjunction with a roll-to-roll process developed for exposing low cost substrates such as acrylic film on a paper backing. Systems having lamps emitting at one of two or three different wavelengths are also provided by the invention. The lamps are arranged so as to have alternating wavelengths, thereby permitting uniform illumination of a surface by each of two or three wavelengths for the purpose of selectively controlling the photochemistry in the tool. As one example, etching and deposition can occur simultaneously (or can be alternated in time) in the same tool.

The resolution of the present fabrication tools and methods is limited by the wavelengths available with the flat lamps. Resolutions offered currently by the present fabrication tools and methods are, therefore, not comparable to the highest spatial resolutions that are presently available. Manufacturers such as Intel and AMD, for example, routinely build electronic products having feature sizes below 20 nm. However, the presently available wavelengths allow for process consolidation, thereby permitting process cost to be reduced significantly. In addition, much photolithography does not require the highest spatial resolution available. In the manufacture of the electronics for flat TVs, for example, the ability to pattern over large areas is important and the highest resolution is not required (although the present process surpasses the resolution currently available in such applications). Sub-200 nm resolution is a valuable process node that can now be accessed with inexpensive arrays of lamps, and a method that combines photolithography, deposition, and etching is provided by the invention.

Suitable flat lamps for photon sources in fabrication tools and methods of the invention include the new 172 nm photoemitting lamps discussed in the background and described in S.-J. Park et al., "25 W of average power at 172 nm in the vacuum ultraviolet from flat, efficient lamps driven by interlaced arrays of microcavity plasmas," APL Photonics, vol. 2, 041302 (2017). The wavelength of this VUV radiation corresponds to a photon energy of 7.2 eV, which the present inventors have recognized as being capable of breaking most chemical bonds, including those required to conduct material removal in semiconductor fabrication processes. Recently, flat lamps emitting at 126 nm, 147 nm, 222 nm, 240-260 nm, and 308 nm have also been demonstrated but the output powers and efficiencies currently available with these lamps are lower at present than those available at 172 nm. Experiments with 172 nm lamps have confirmed a photolithographic method and tool capable of forming any desired pattern directly into a thin film or thin plate (or even bulk material) of a polymer such as acrylic polymethyl methacrylate (PMMA), polycarbonates, ABS (acrylonitrile butadiene styrene), CR 39 (allyl diglycol carbonate), PET (polyethylene terephthalate), polystyrene, and other materials. The resolution of this process has been demonstrated to be better than 150 nm and is suitable for roll-to-roll processing which, to our knowledge, has not been possible previously with sub-200 nm spatial resolution.

Preferred fabrication tools and methods can also be used to fabricate optical and biomedical components such as gratings, Fresnel lenses, phase masks, waveguides, other optical components, and microfluidic channel arrays as well as other biomedical and microfluidic components and devices directly into a polymer. Such components can be produced directly and inexpensively into acrylic (and other polymer) films, plates, or thin sheets, or even bulk material. Such components can be the basis for realizing extremely compact optical spectrometers, imaging systems, and even decorative items or "watermarks" on various surfaces. With respect to the latter, watermarks and other information can be encoded into polymer films and sheets (such as those in which different forms of product and personal identification are sealed), and "read" only by processing the polymer with a liquid such as acetone or alcohol. This information is not visible by optical techniques such as microscopy.

PMMA is well-known as a photoresist for electron-beam (e-beam) lithography. E-beam lithography is a mask-less technique allowing for resolution of 10 nm. It is a slow technique due to the fact that an electron beam rasters the surface and has to "expose" each feature individually. Consequently, the 172 nm photolithographic technique described here can be used in conjugation with e-beam lithography in an effort to accelerate the lithography process. Therefore, the 172 nm and e-beam lithography processes may be used to concentrate on the >200 nm features during the first fabrication step. The sample is then loaded into an e-beam lithography tool and only small features are produced in the second step with e-beam. Such a hybrid technique will allow to (at least an order of magnitude) decrease the cost and time required to fabricate large and small features in a single PMMA film.

Such components and devices can also be fabricated in metal, ceramics, or other materials by overcoating patterns in a polymer surface with the desired material, and subsequently removing the underlying polymer with solvents (wet chemistry) or by dry etching.

Irradiation of polymers with VUV radiation renders polymer surfaces hydrophilic which, in turn, allows for a variety of anti-fogging surfaces to be realized. For example, car windshields, goggles, eye glasses, and the surfaces of camera lenses can now be processed with VUV radiation so as to continue to be transparent in the face of fog, rain, or spray in marine environments.

Preferred embodiments of the invention will now be discussed with respect to the drawings and experiments used to demonstrate the invention. The drawings may include schematic representations, which will be understood by artisans in view of the general knowledge in the art and the description that follows. Features may be exaggerated in the drawings for emphasis, and features may not be to scale.

FIG. 1 is a diagram in cross-section of a preferred embodiment fabrication tool 10 of the invention, showing a flat, thin lamp or lamp array 12 in chamber 14, emitting in the VUV or UV regions of the spectrum (nominally 100-400 nm) and irradiating, through a mask 16, the surface of a semiconductor wafer 18 or other surface that has been coated with a thin film of a polymer. The mask 16 may be in direct contact with the substrate 18 or situated in proximity to the substrate 18. Alternatively, the desired pattern can be projected onto the surface of wafer 18 with a mask not in proximity to the wafer surface. The position of the mask 16 in FIG. 1 is determined by the mask characteristics, the wavelength of the lamp or lamp array 12, and the desired resolution on the wafer surface. Depending on the process to be performed, a gas or vapor or mixture thereof can be flowed through the chamber through a gas inlet 20 with the gas pressure and flow rate controlled electronically by valves and mass flow controllers (not illustrated). If the desired process is photolithography, the chamber 14 can be evacuated with a vacuum system 22 (typically including a turbomolecular pump) to a base pressure typically less than $10^{-6}$ Torr. However, it is often advantageous to allow an inert (buffer) gas to flow slowly through the chamber for the purpose of cooling the front face of the lamp(s). For a photolithographic process, the buffer gas should not absorb appreciably at the lamp wavelength. For a lamp wavelength of 172 nm (emitted by the $Xe_2$ molecule), therefore, dry nitrogen, He, Ne, and Ar are suitable gases but nitrogen is preferred because of its low cost. At shorter lamp wavelengths (such as 126 or 147 nm from $Ar_2$ and $Kr_2$, respectively), helium is a preferred choice because of its high thermal conductivity and transmission down to the lower bound of the VUV region, but also because it may be re-circulated and "scrubbed" cryogenically so as to minimize cost.

To perform a photolithographic process with a VUV/UV lamp according to a preferred method, the wafer or other substrate 18 is first spin-coated with a thin film of the acrylic polymer PMMA (poly-methyl methacrylate) or other organic polymer. A wide variety of organic polymer materials have been shown to function well for the applications described here, including polycarbonates, ABS (acrylonitrile butadiene styrene), CR 39 (allyl diglycol carbonate), PET (polyethylene terephthalate), and polystyrene. Most of the early experiments were carried out with PMMA films having a thickness of 15-200 nm but the range can be broader if the lamp intensity is above several tens of $mW/cm^2$. Direct irradiation of such polymer films (or thin plates or even bulk material) with VUV photons produced by the lamp ablates non-thermally the films at a rate dependent upon the lamp intensity (i.e., photon arrival rate). For example, the measurements of FIG. 2 were acquired by irradiating a 25 nm thick PMMA film with a 172 nm lamp intensity of 100 $mW/cm^2$. Manufactured by Eden Park Illumination, the lamp is square (4"×4" or 10 cm×10 cm), and has a thickness of 3.8 mm. The lamp may be mounted within the photolithography chamber or situated outside, with a window integrated into the chamber so as to allow for the entrance of the VUV radiation.

Polymer Photoablation Data

Figure 2:
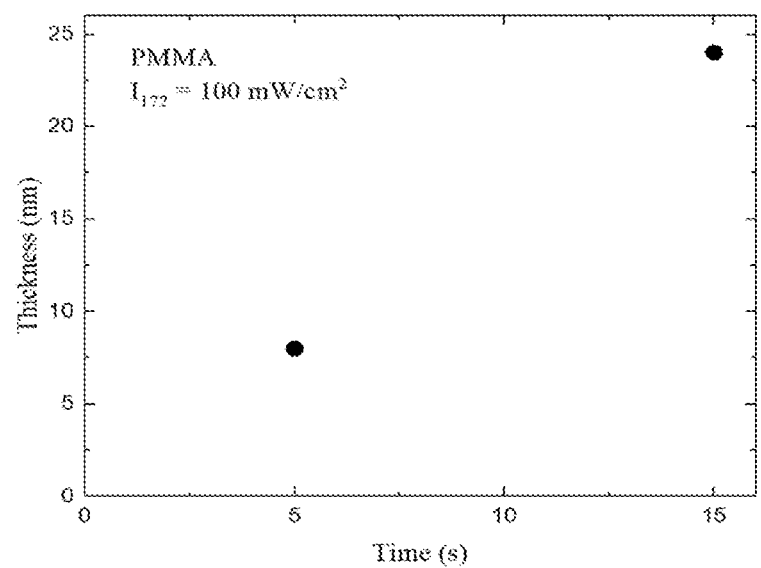
FIG. 2 provides data relating to the removal of a PMMA film (on Si) by a 172 nm ($Xe_2$) lamp producing an intensity of 100 mW/cm$^2$ at the surface of the lamp in an experimental process of the invention.
Figure 3A:
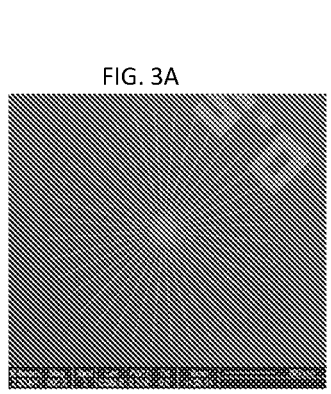
FIGS. 3A-E are SEM images of patterns formed in acrylic films by irradiating the films through a photomask with a 172 nm flat lamp in an experimental process of the invention.
Figure 3B:
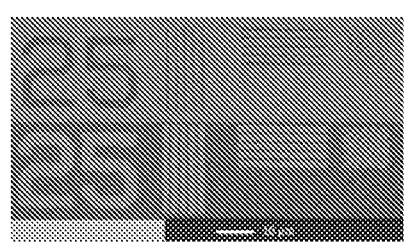
Figure 3C:
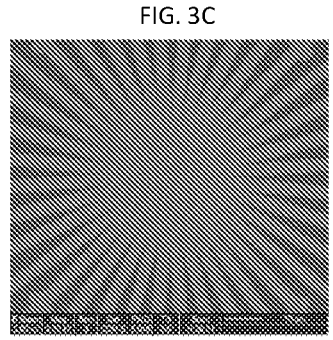
Figure 3D:
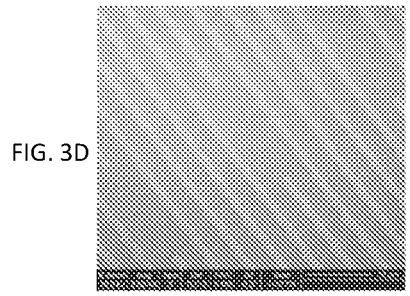
Figure 3E:
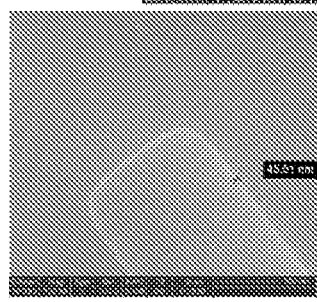
Figure 4A:
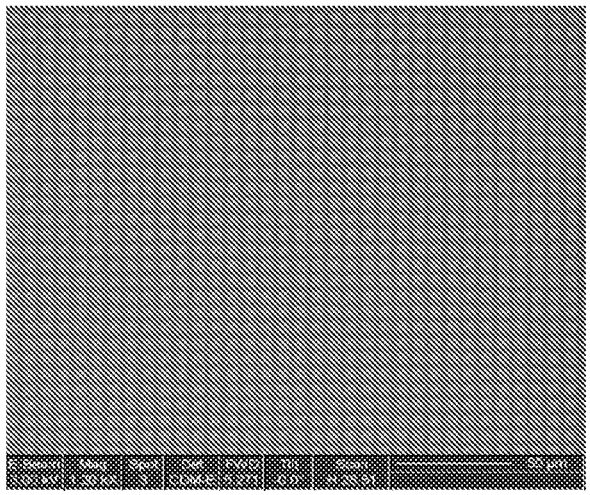
FIG. 4 includes additional SEM images of patterns formed in acrylic films by irradiating the films through a photomask with a 172 nm flat lamp in an experimental process of the invention.
Figure 4B:
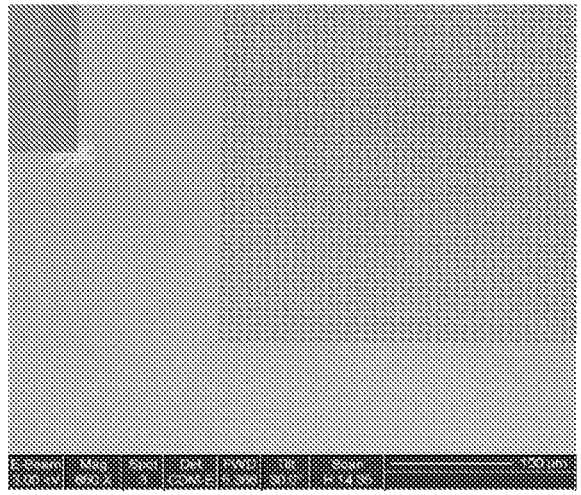

The significance of the data of FIG. 2 is that PMMA films can be patterned without the need for a photoresist. Also, there is no need for a gas (such as $O_2$ for the purpose of producing ozone) to assist in the material-removal process, and photolithography may be performed over a wide range in chamber pressure. Thus, the lamp 12 (in combination with the polymer film) acts to simultaneously produce the desired pattern in the film but also to physically remove the undesired portions (regions) of the acrylic film. This process is known as photoablation and is significant because experiments show that it results in little heating of the substrate. This is an enormous advantage for photolithography because the semiconductor wafer need not be removed from the processing chamber in order to process the wafer with a solvent, or etch it with a plasma tool. Rather, the portions of the PMMA film exposed to the incoming radiation are photoablated by the 172 nm photons. That is, the photon energy of 7.2 eV (for a lamp wavelength of 172 nm) is sufficiently large that the light breaks chemical bonds in the PMMA film, resulting in the release of molecular fragments into the processing chamber 14. Another way to say this is that the VUV "vaporizes" (non-thermally) the portions of the PMMA film that are exposed to the lamp by the photomask. This type of process has not been observed previously with a lamp optical source. It has been observed with an ArF (argon fluoride, 193 nm) excimer laser irradiating polymers and the success of this 193 nm laser in the eye surgical process known as LASIK, for example, has been attributed to the high peak intensity for this pulsed laser, in synergy with the photon energy (6.43 eV at 193 nm). In the process reported here, however, the peak intensity of a 172 nm lamp (less than 1 $kW/cm^2$), for example, is more than three orders of magnitude lower than the peak intensity of an excimer laser (on the order of MW/cm²). Consequently, the photoablation of polymer films with the peak VUV intensities available at 172 nm (or elsewhere) with lamps was unexpected.

Therefore, the process disclosed here also differs considerably from the conventional approach in which a photoresist has its chemical structure altered by the incoming UV radiation, but photoresist material is not removed by the optical source (laser or UV lamp). An additional procedure, either wet or dry etching of either the irradiated or non-irradiated photoresist, is normally necessary to define the desired pattern. In other words, the combination of 172 nm radiation and the appropriate polymer film(s) allows for the desired photolithographic pattern to be produced directly and immediately. No separate development and film removal processes are necessary or desirable. Other lamp wavelengths in the 160-200 nm wavelength interval will also prove to be effective. Wavelengths shorter than 160 nm are also likely to be effective but have not been explored because the purge gas nitrogen begins to absorb significantly in this wavelength region.

The data of FIG. 2 show that the polymer film ablation rate is initially linear in the time over which the film is exposed to the lamp radiation. For exposure times beyond approximately 15 s (for a lamp intensity of 100 mW/cm²), however, the ablation rate shows signs of saturation. This nonlinear behavior of the photoablation process can be exploited to realize complex nanoscale structures by multiple exposures of the polymer film surface.

In addition to photoablation, non-ablated (but exposed) areas of some polymers are photochemically altered (photo-modified) in such way that the photo-modified layer may be easily removed by rinsing it with IPA, acetone, or other solvents. Although this step is not required for most polymers, it may be optionally used to increase the depth of photoablated structures.

Representative Patterns, Complex Structures by Multi-Step Exposure

FIGS. 3A-3E and 4A-4B show various patterns produced in PMMA films by irradiating the films through a photomask in a chamber similar to that shown in FIG. 1. For these tests, a 25 nm thick PMMA film was spin-coated onto a silicon (Si) substrate and then placed into a vacuum chamber having a lamp mounted immediately outside the chamber. The base pressure in the chamber was less than $10^{-7}$ Torr but this photolithographic process functions well even with 1 atmosphere of a gas such as $N_2$ in the chamber. This is an enormous manufacturing advantage because the processing chamber need not be evacuated to a low base pressure, but rather the room air initially in the chamber can be thoroughly flushed with nitrogen or a rare gas. A $MgF_2$ window allowed for the 172 nm photons to enter the chamber and irradiate the film in regions defined by the mask. After 20 seconds of irradiation of the film, the film was removed (by nonthermal photoablation). Examination of the resulting patterns with an electron microscope (SEM) shows that the resolution of this photolithographic process is better than 150 nm, although additional testing is expected to provide a lower limit.

It must also be emphasized that the photolithographic process described above is quite different from that reported by Asakura et al. [1] in 2006 and discussed in the background. The present method does not require ozone for removal. Indeed, the use of ozone or other chemical to remove surface material may be counterproductive because it may well remove material outside the predetermined (desired) area on the substrate surface. For the experiments performed to date, the chamber containing the lamp and the PMMA-coated Si substrate was evacuated with only a roughing pump to pressures below 0.5 Torr and then back-filled with dry $N_2$. This process was repeated at least 3 times before exposing the PMMA film We conclude that the results of FIGS. 3 and 4 are due to ablation, by the 172 nm photons in a nonthermal manner, of only the portions of the PMMA film surface that are exposed to the lamp. It should be reiterated that this dry photolithographic process allows for the mask and substrate to remain in the processing chamber after the pattern is established in the ablation layer for further processing. Indeed, one may proceed immediately to the next process without "breaking vacuum" in the chamber.

Figure 5:
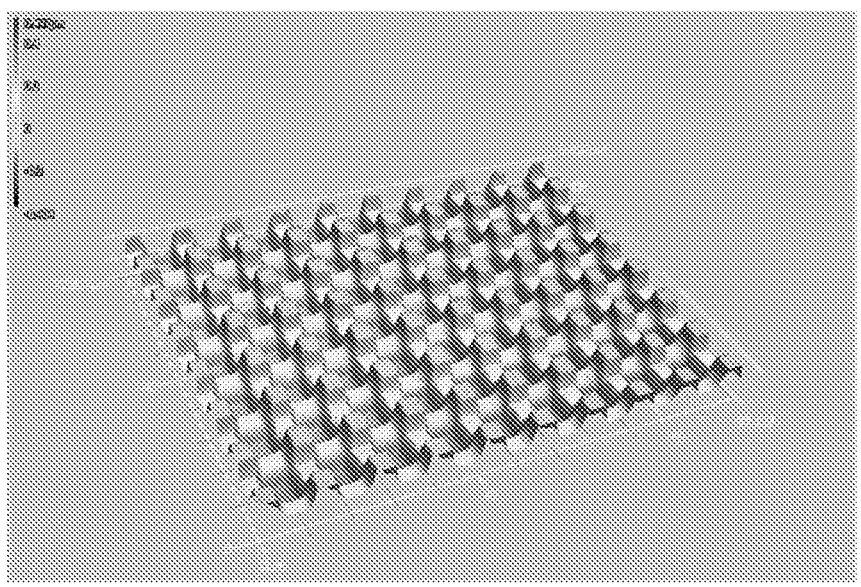
FIG. 5 is a false color image (rendered in grayscale) of a 3D periodic nanoscale network that has been fabricated in PMMA by a preferred embodiment two-exposure process.

FIG. 5 is an image, presented in grayscale but was originally in false color, of the topography of a nanoscale structure that was formed in a PMMA film by a double exposure of the polymer film to the lamp source. Specifically, the 3D structure of FIG. 5 was fabricated by two sequential exposures of the polymer surface, interspersed with solvent rinsing. The procedure is as follows. The PMMA film was first exposed to the 172 nm lamp (intensity of 100 mW/cm²) for 25 seconds through a mask having 5 μm features in the form of a periodic grating. The surface was then rinsed in isopropyl alcohol (IPA) for 4 seconds and deionized (DI) water for 4 seconds. The photomask was then rotated by 90 degrees, after which the same exposure and rinsing processes were repeated. The result is an array of 5 μm square features having depths of 320 nm and 640 nm, and sidewalls that are steep. This surface pattern can subsequently be replicated in a metal or ceramic material, for example, by overcoating the polymer pattern of FIG. 5 (or any other pattern) with the desired material of the desired thickness and then removing the polymer on the "back side" by wet chemistry or dry etching. That is, the polymer patterning processes can be used to form a mold or template for further processing. It must be emphasized that surface patterns can be readily produced in polymers, metals, ceramics, and other materials that are difficult to fabricate by other techniques.

Figure 6:
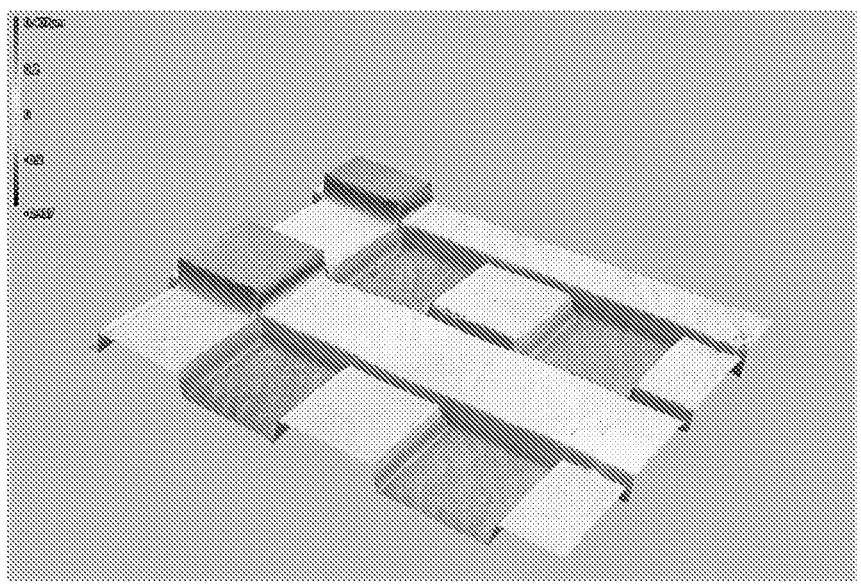
FIG. 6 is a false color image (rendered in grayscale) of another nanoscale network that has been fabricated by a preferred embodiment two-step exposure process.

FIG. 6 is another example of a network of micro- and nano-scale features that can be fabricated into a polymer surface by direct polymer ablation through one or more masks with a VUV lamp. This particular network was fabricated by the same process as that of FIG. 5 which requires the rotation of a single mask.

Figure 7:
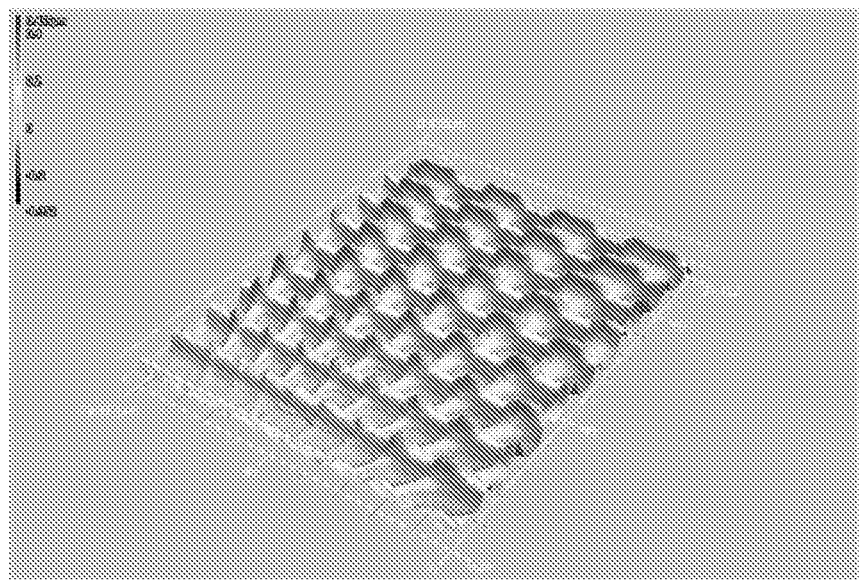
FIG. 7 is a false color image (rendered in grayscale) of a "Spider Web" structure, fabricated with two different masks and sequential exposures of a PMMA surface in accordance with a preferred embodiment process.

FIG. 7 is a grayscale image (originally in false color) of a "Spider Web" structure that was also fabricated by two sequential exposures of a polymer surface. In this instance, however, two different masks were employed and the procedure is as follows. The surface was first exposed for 25 seconds through a mask with a lamp intensity of 100 mW/cm². This first mask was then replaced with a second mask having a different pattern, and the surface was again exposed for 25 seconds at the same lamp intensity. Afterwards, the surface was rinsed in IPA for 4 seconds and DI water for 4 seconds. The result is a structure in which the features are smoothed by the second exposure. Such a process is suitable for fabricating sinusoidal and variable-pitch ("chirped") optical gratings, and gratings for high power femtosecond lasers (after converting the polymer pattern into metal).

The multiple mask processes can also be employed to fabricate components and devices from metal, ceramics, or other materials having a surface pattern that is inverted (i.e., is the "mirror image") from that of the processed polymer surface. That is, one first fabricates into the polymer surface the inverse of the desired pattern. Consequently, after the ceramic, metal, or other material is deposited onto the polymer surface and the polymer itself is subsequently removed, then the metal or ceramic surface that is exposed by the polymer removal will be the mirror image of that impressed into the polymer surface by the VUV radiation.

Photon Flat Lamp "Domes" and Other Lamp Ensemble Geometries

The source of the UV/VUV radiation is a flat lamp, or an array of lamps in preferred embodiment fabrication tools. Flat lamps driven by an array of microplasmas (described by S.-J. Park et al., APL Photonics, vol. 2, 041302 (2017)) can be "tiled"—installed in a frame so as to realize a source of intense VUV and/or UV radiation over areas exceeding 1 $m^2$, if required. FIGS. 8A-8B and 9A-9B are diagrams of one embodiment of a lamp-tiling frame which provides electrodes and electrode contacts, as well as dielectric spacers.

FIGS. 8A and 8B show that a top side includes an electrode plate 52, and the bottom side includes bottom grid 54 that serves as a frame to mount a plurality of square microplasma flat lamps 56. The grid 54 also includes lamp electrodes 58 to power the square microplasma flat lamps 56.

The bottom view of FIG. 8B shows that inserting the lamps 58 into the grid frame 54 naturally produces physical "seams" in the structure. However, diffraction of the VUV/UV radiation as it propagates away from the grid frame 54 will "fill-in" the intensity distribution when an appropriate distance from the surface to be irradiated is maintained. This distance may vary from less than 2 mm to more than several cm, depending on the application. That is, the variation in the lamp intensity over the processing surface that can be tolerated differs for various applications.

Figure 9A:
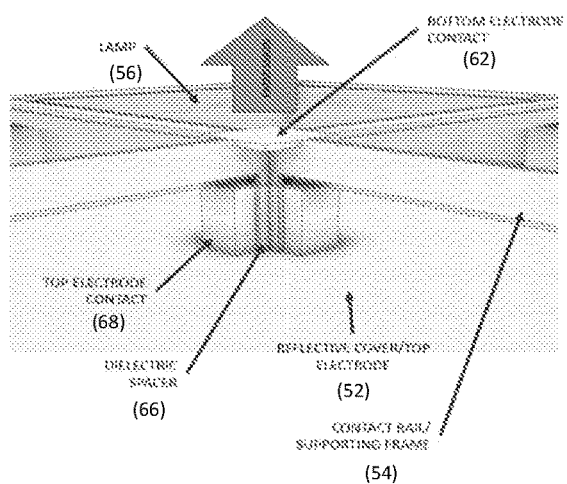
FIGS. 9A and 9B are partial views of a preferred embodiment, flat lamp photon source mounting in a fabrication tool of the invention, including details for providing electrical power to the flat lamp photon source.
Figure 9B:
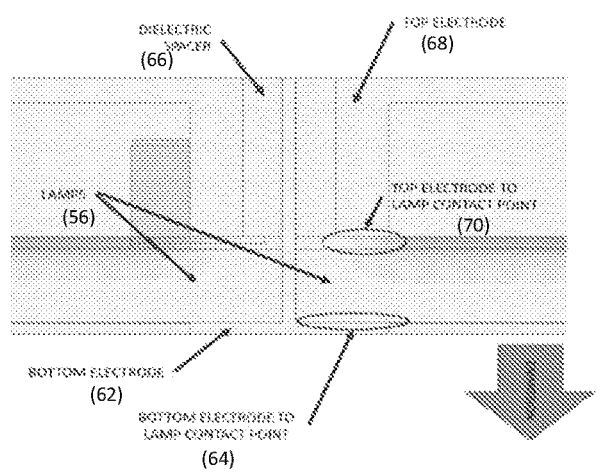

FIGS. 9A and 9B illustrate additional details of a preferred embodiment. In the region of intersection of portions of the grid frame 54, a bottom contact 62 contacts a first (bottom) electrode 64 of each of four lamps 56 (one is omitted in the figure to show other details) at the region of intersection. Dielectric spacers 66 electrically insulate the grid 54 from top electrode contact regions 68. The top electrode contact regions contact a second (top) electrode 70 of each of the four lamps 56.

Figures 10A, 10B, 10C:
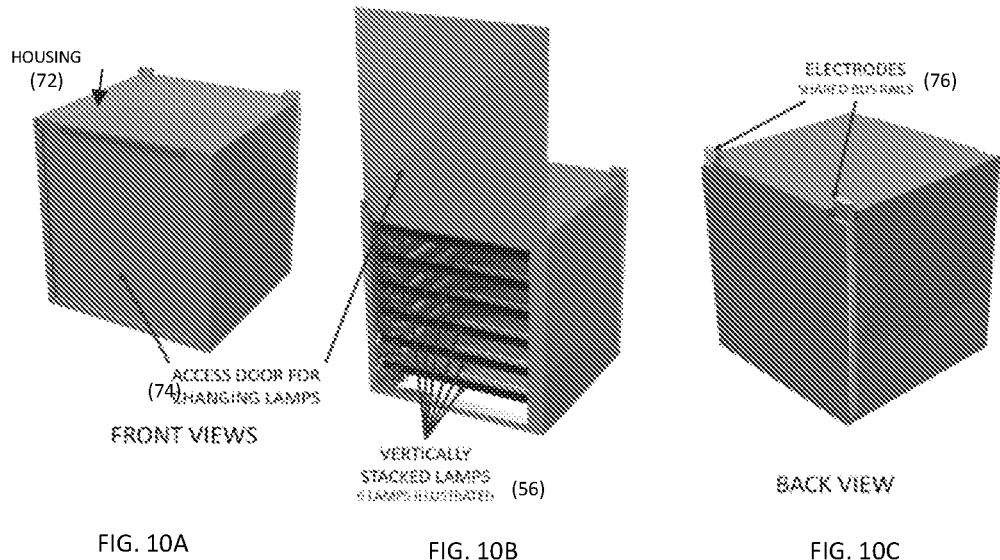
FIGS. 10A-10C are diagrams of preferred embodiment, vertically-stacked flat lamp photon sources for a fabrication tool of the invention, including details for providing electrical power to the flat lamp photon source.
Figure 11A:
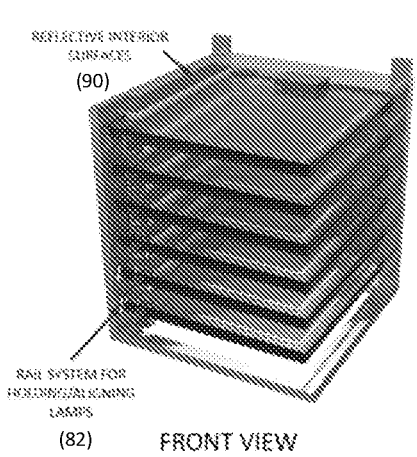
FIGS. 11A-14H are schematic diagrams of a preferred embodiment, flat lamp photon source in the form of a dome for a fabrication tool of the invention.
Figure 11B:
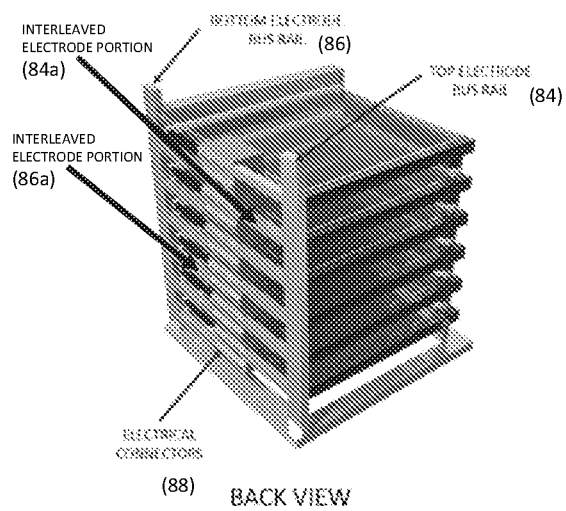

Another lamp geometry is shown in FIGS. 10 and 11. A housing 72 includes an access door 74, such as that shown sliding out of slots defined in the housing 72. Lamps 56 are mounted vertically on internal slots or rails 82 and contact two separate shared bus-rail electrodes 76. The rail electrodes 76 include a top electrode rail 84 and a bottom electrode rail 86 that have interleaved contact portions 84a and 86a that contact separate first and second electrodes of each lamp via electrical connectors 88. The lamps 56 are simply arranged in a vertical stack in the housing 72 for the purpose of delivering an intensity greater than that available from a single lamp. To accomplish this objective, the front and back faces of the individual lamps would not normally have a reflecting surface (other than that specified by normal Fresnel reflection), and the radiation provided by one lamp will simply pass through the others in the stack and exit the housing 72 which has no bottom or no window to pass the combined emissions from the stacked lamps 56. The interior of the housing preferably includes reflective surfaces 90 to redirect transmissions toward the objective. This geometry has the advantage of combining the transmission afforded by multiple flat lamps to increase the total radiation output. A disadvantage of this embodiment is that each lamp will have a transmission coefficient of nominally 60-85%, depending on the lamp design. Consequently, the farther a lamp is from the exit plane of the array, the less of its radiation that will actually reach the surface to be treated. However, the geometry of FIGS. 10 and 11 is inexpensive to fabricate and maintain because individual lamps can be slid horizontally out of the array and easily replaced, if desired.

Figures 12A, 12B:
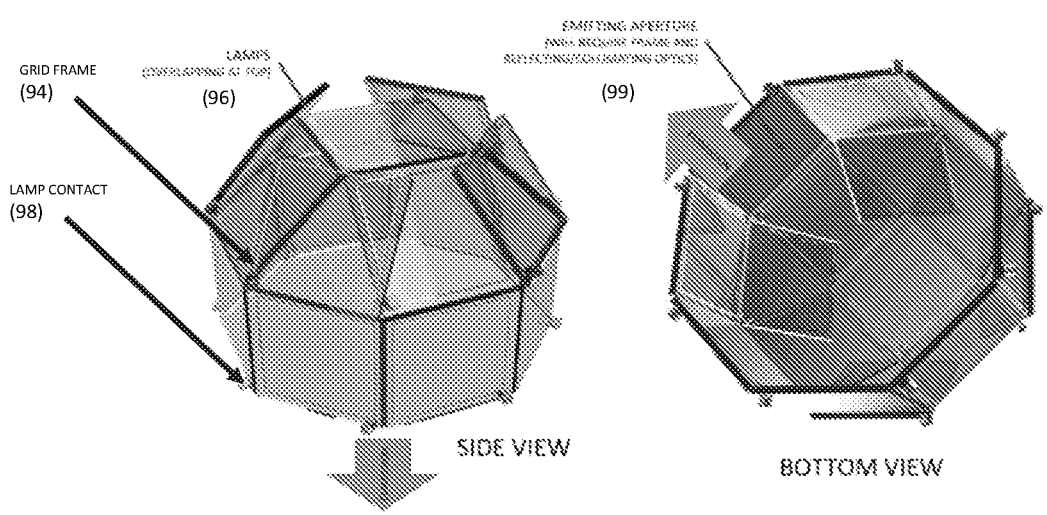

FIGS. 12A-13B are diagrams of a spherical or "dome" geometry for arranging the lamps so as to increase, and homogenize, the spatial distribution of the VUV/UV radiation intensity reaching a surface to be illuminated. The arrangement of FIGS. 12A-12B is designed to utilize flat lamps of a single given size (such as square or rectangular). A grid frame 94 is constructed in comparable fashion to the grid frame 54, shown in FIG. 8B, and is able to accommodate multiple flat lamps 96. The grid 94 includes electrodes for supplying electrical power to one electrode of each lamp. Each lamp has a contact 98 for receiving electrical power to its other electrode. The combined emissions of the lamps in the dome structure exit through a plane at the base of the dome, the emission aperture 99.

Figures 13A, 13B:
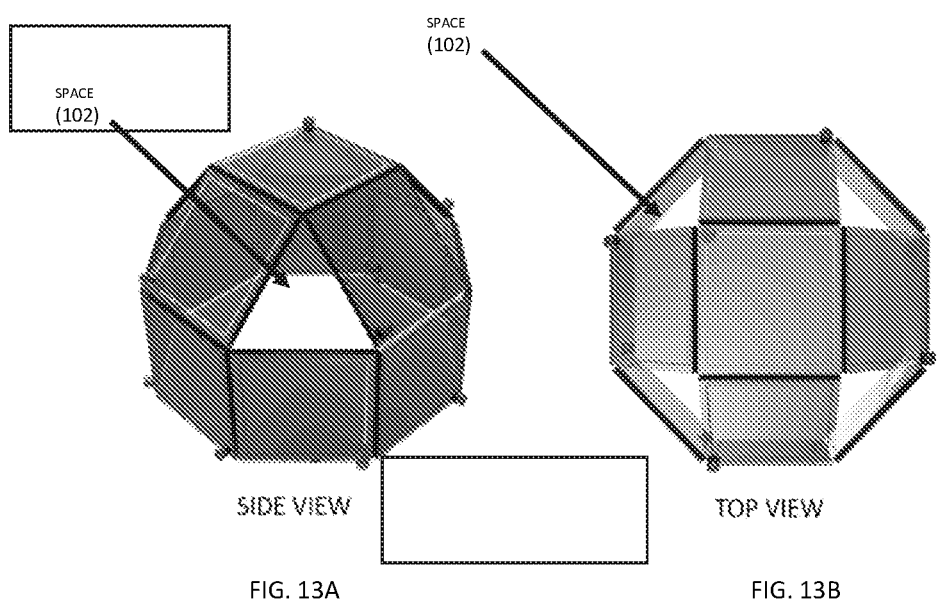
Figure 14A:
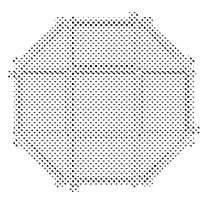
Figure 14B:
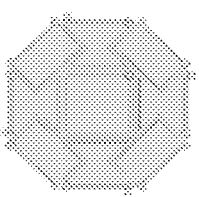
Figure 14C:
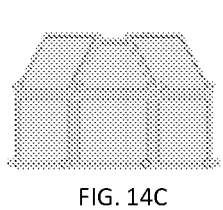
Figure 14D:
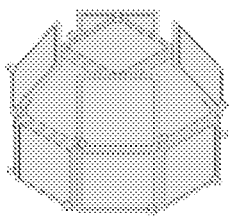
Figure 14E:
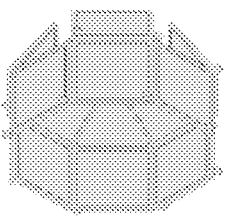
Figure 14F:
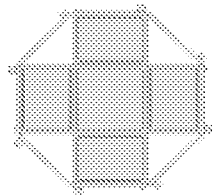
Figure 14G:
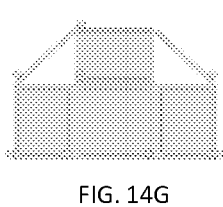
Figure 14H:
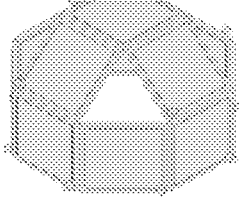
Figure 16A:
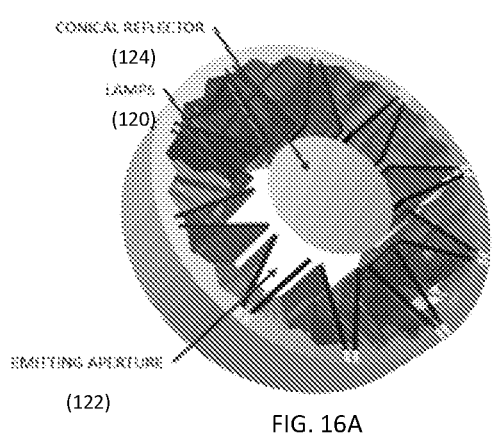
Figure 16B:
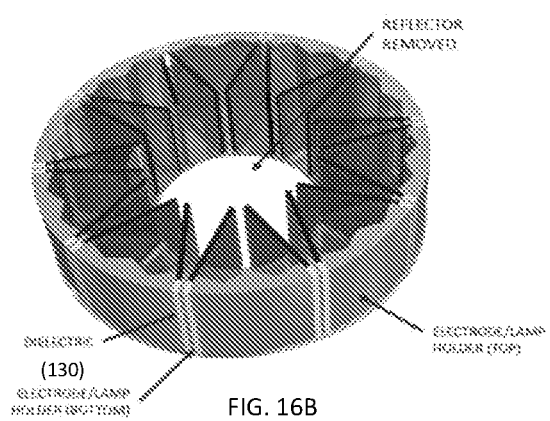

The geometry includes overlap of the lamps at several different locations but this is inconsequential for achieving a uniform intensity profile beneath the dome, as shown by the emissions arrow in FIGS. 12A and 12B (in which the surface to be illuminated or treated lies in a plane below the dome). FIGS. 13A and 13B show a similar geometry that avoids the overlap of the intensity spatial profile of individual lamps by having triangular spaces 102 that lack a flat panel lamp. This space can be left unoccupied, or it is able to accommodate a panel having a reflective surface so as to direct VUV/UV radiation toward an aperture (bottom of FIG. 13A) as in FIGS. 12A-12B.

FIGS. 14A-14H show several different embodiments of the dome geometry in which different numbers of lamps are involved, and their placement is altered according to the requirements of the application at hand Several versions intentionally overlap the radiation emitted by two or more lamps (as in FIGS. 9A and 9B) and others do not. The entire assembly of lamps can be cooled by flowing dry or research grade nitrogen, He, or other (non-VUV/UV absorbing) gas at a slow rate through the assembly. A slow gas flow rate is desirable to minimize turbulence and refractive index variations within the dome assembly.

FIGS. 15A-18M illustrate a radial lamp arrangement in which flat panel lamps 120 are arranged along an N-point star (where N is an integer >3) pattern and the combined radiation of the lamps reaching the axis of the system is directed by a conical reflector 124 through a circular emitting aperture 122. A housing 126 accommodates the lamp arrangement. As seen in FIG. 16B, which omits the reflector for clarity, dielectric 130 isolates first electrodes 132 that provide energy to a top first electrode of each lamp 120 and second electrodes that provide energy to bottom second electrodes of each lamp 120.

With reference to FIGS. 17A and 17B, an inner portion of the housing 126 includes slots or rails 140 to physically position the flat lamps 120. With the electrodes of the housing omitted, lamp contacts 142 that electrically connect with those electrodes are visible, and a reflective inner surface 144 of the housing is illustrated. In this geometry, the lamps 120 are mounted into the housing 126 that situates the lamps such that they are not parallel to one another, but rather form an angle with respect to one another. This geometry serves to direct radiation from each lamp onto the conical reflector 124 whose axis coincides with the optical system axis that is perpendicular to the emitting aperture. The conical reflector 124 has a highly reflecting surface (at the desired wavelength(s)) on the cone's exterior surface. Furthermore, an individual lamp can be easily removed by removing the housing cover in the same manner as discussed with respect to FIGS. 10A-10C. In other embodiments, the radial array can have an interior wall that is angled (i.e., has a "sawtooth" structure) and reflective so as to deflect VUV/UV radiation towards the axis of the system and, hence, the conical reflector which, in turn, directs the radiation out of the housing and toward the surface to be illuminated. Once again, dry nitrogen may be flowed through the lamp housing in order to cool the mirror and lamps. Processing the nitrogen in an external, closed-loop flow system (that may be cryogenic) is desirable so as to remove impurities in the gas flow that are capable of strongly absorbing at the wavelength(s) of the lamp.

Roll-to-Roll Processing System

Because the lamp exposure times required to pattern thin acrylic/PMMA and other organic films with 172 nm lamps, for example, are short (on the order of seconds) for lamp intensities above ~50 mW/cm$^2$, photolithography can now be realized with a roll-to-roll system such as that shown in FIGS. 19A-19B (double-sided processing) or 19C-19D (single-sided). An organic polymer film 160 having a predetermined thickness can be fed from a roll 160 at right in FIG. 19. The film passes beneath a photomask (as illustrated in FIG. 1) having the desired architecture (pattern, network, etc.). During its traversal of the system, any portion of the acrylic film must be exposed for a predetermined time to the VUV/UV radiation source(s) 162. The exposure time will depend on the lamp(s) intensity and polymer film composition and thickness as well as the distance from the radiation source to the surface. Consequently, the speed of the film will be dependent on several factors and can readily be calculated. It is advantageous to expose the polymer film with a lamp array of extended length so that a larger area of material can be treated simultaneously. This will also allow the speed of the film surface to be increased. Finally, it should also be mentioned that the organic polymer film can have a paper-backing during processing. Commercial products are available having different polymer films with a paper backing which, during the transit of the film through the system, will minimize or prevent damage to the film After the film is exposed to the VUV/UV source and thereby patterned, the paper backing can be readily removed. It is also possible to irradiate the film from both sides if the organic polymer has no backing. In this situation, one pattern or device can be formed on one face of the film and a second pattern, device, or optical component produced on the opposite face of the polymer film Two Processes Conducted in a Single Chamber The embodiment of FIG. 1 may also be used for two or more processes by simply switching the gas flow with conventional mass flow controllers and valves. For example, with a lamp emitting at 172 nm, photolithography can be performed by the process described earlier. During this photolithographic process, the chamber 14 may be evacuated, or dry nitrogen can be flowed through the chamber 14 because this gas does not absorb appreciably at 172 nm. Thus, the gas will not have any deleterious effects on the photolithographic process.

Figure 20:
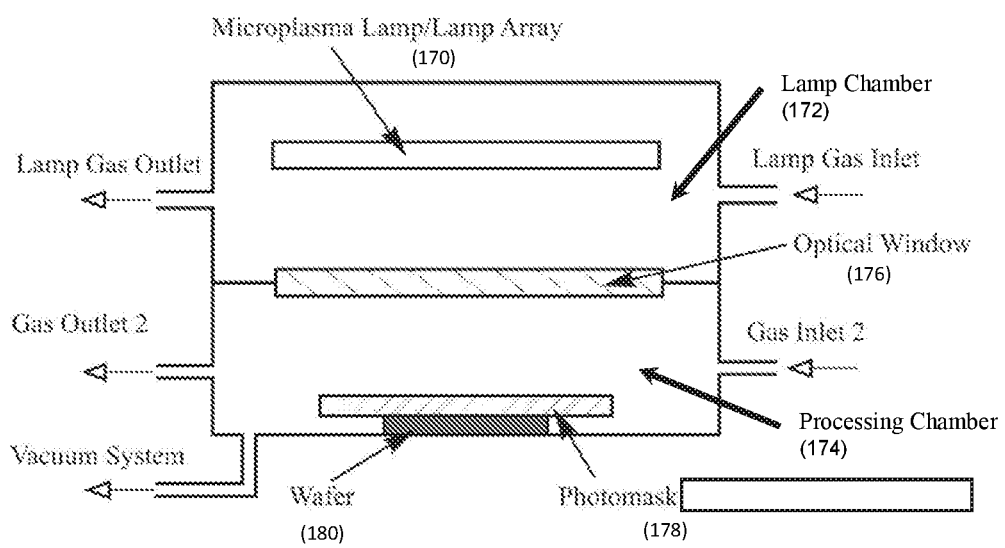
FIG. 20 is a schematic diagram (in cross-section) of a double-chambered preferred embodiment fabrication tool in which a microplasma lamp in one chamber drives a process, such as photolithography, thin film etching or deposition, in the second chamber.

Another embodiment is shown in FIG. 20 and is based upon a number of features of FIG. 1, all of which are incorporated into FIG. 20. Salient differences between the two are discussed here. In the FIG. 20 system, a UV/VUV lamp or array of lamps 170 is situated in its own chamber 172 adjacent to a processing chamber 174. Window 176 allows for the passage of VUV/UV radiation between the two chambers. One again has the option of evacuating the upper chamber 172 of the two-chamber system or flooding this chamber with dry nitrogen which would normally be flowed (as opposed to having a static gas fill). The window 176 at the center of FIG. 20 may be fabricated from any material that transmits efficiently at the lamp wavelength(s). For a 172 nm-emitting lamp, this includes fused silica, quartz, sapphire, magnesium fluoride, and other materials. The lower chamber 174 of FIG. 20 receives radiation from the lamp(s) 170 through a window 176 and a pattern is defined by a mask 178 so as to perform a process on the surface of a semiconductor wafer (or other substrate) 180 that is dependent upon the lamp wavelength and the gas or gas mixture flowing through the lower chamber 174. With the system of FIG. 20, multi-step processes can take place in the same chamber without the need for removing the substrate. It may, however, be necessary to change the photomask between process steps but this is readily achieved with a standard load-lock system, and is preferable to moving the substrate itself. An example of a process sequence is one that begins with photolithography to define the layout of electronic devices, interconnects, microfluidic channels, etc. A thin layer of PMMA or other polymer is spin-coated onto the substrate which is then placed into the chamber of FIG. 1 or the lower chamber of FIG. 20. After installation of the first mask on the substrate (or in close proximity to the substrate), this chamber is evacuated and the polymer film is exposed by the lamp through the photomask. This process opens "windows" in the polymer film for further processing. The second process may involve the same mask or switching to a second mask, after which the flow of the first gas mixture is initiated. If the next step is etching of the exposed regions of the substrate, a mixture of CCl$_4$ vapor and a rare gas such as Ar (for example) is introduced to the chamber by mass flow controllers. Carbon tetrachloride is commonly used by commercial plasma tools to etch semiconductor wafers such as silicon. However, the result of a CCl$_4$ molecule absorbing a 172 nm photon, for example, is the rupture of a C—Cl chemical bond, thus freeing both a chlorine and carbon atom. Consequently, with the same lamp or lamp array in place, both photolithography and etching can be executed with a semiconductor wafer or other substrate within the same chamber.

Similar comments can be made for the process of film deposition. It is well-known that metal-bearing precursor molecules such as trimethylaluminum (TMA) or triethylgallium (TEG) are photodissociated by 172 nm photons. That is, the Al—CH$_3$ bonds in TMA, for example, are broken by the absorption of one or more photons, eventually liberating an Al atom. Consequently, films of virtually any metal (Al, Ag, Au, Cu, etc.) can be deposited into windows in the photomask by the photodissociation of the proper precursor (CuAcAc for Cu, TMA or TEA for Al, etc.). Similarly, compound semiconductor materials such as AlN or GaN can be grown by irradiating a mixture of TMA and ammonia (NH$_3$) with the lamp or lamp array. Both molecules are known to absorb strongly at 172 nm. In the past, films such as AlN or GaN were generally grown by a thermal process such as MOCVD or MBE but the recent availability of efficient lamps operating in the UV/VUV regions opens the door to breaking (non-thermally) the bonds of a wider array of molecules than has been possible in the past. Therefore, the same lamp may be used for the process of photolithography, etching, and deposition. Because the nature of the process occurring in the chambers of FIGS. 1 and 20 depends primarily on the identity of the gas, gases, or vapors introduced to the chamber by computer-controlled valves and mass flow controllers, the system is able to switch quickly from one of these three processes to another. One exemplary application is the growth of superlattices, such as AlN/GaN layered structures, comprising alternating layers of GaN and AlN.

Two or More Lamps of Differing Wavelengths

Engineering of the process sequence may require two or more lamps of different wavelengths. Since lamps having wavelengths of 126 nm, 147 nm, 222 nm, 308 nm, and other wavelengths are now available in a flat form factor, it is possible to irradiate a mixture of gases or vapors with a particular lamp emitting a first wavelength which interacts with only one gas in a mixture. For example, a lamp having a wavelength of 222 nm (radiated by the KrCl molecule) has a photon energy capable of photodissociating several metal alkyls but not ammonia (see Photochemical Vapor Deposition, 1992). However, the 172 nm wavelength of a $Xe_2$ lamp is capable of dissociating both molecules. Therefore, those skilled in the art will recognize gas/vapor and lamp combinations capable of rapidly depositing or etching films.

Figure 21:
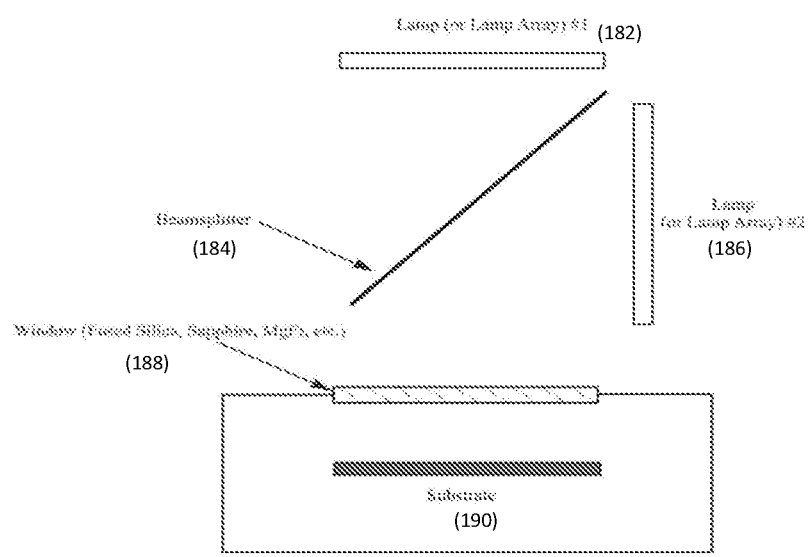
FIG. 21 is a diagram of an optical arrangement for directing radiation of two flat lamp photon sources toward a substrate for a fabrication tool of the invention.
Figure 22:
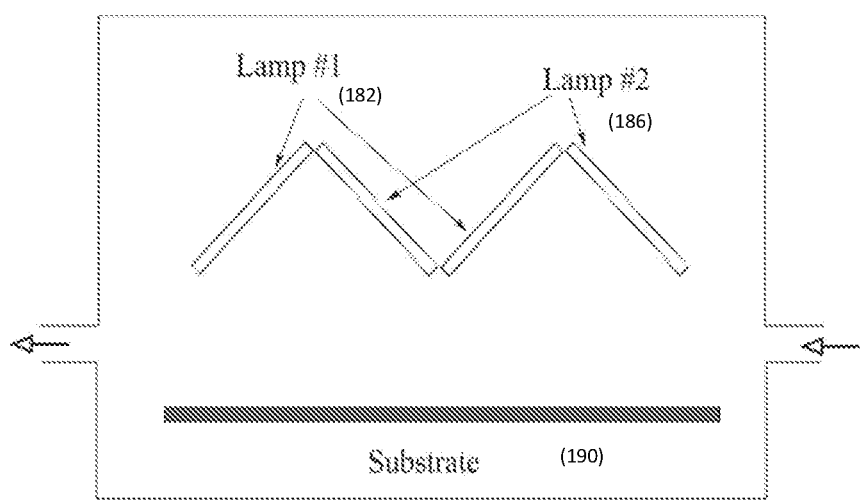
FIG. 22 is a diagram of an optical arrangement for directing radiation of multiple flat lamp photon sources toward a substrate for a fabrication tool of the invention.

When lamps of two different wavelengths are required, FIGS. 21 and 22 illustrate two embodiments that are a modification of either of FIG. 1 or 20 and which allow for at least two lamps to be incorporated into a system. In FIG. 21, a first lamp 182 emits at a first wavelength that is transmitted by a beam splitter 184 and a second lamp 186 of a second wavelength that is reflected by the beam splitter 184. The different wavelengths are directed into a processing chamber though a window 188 and mask to a substrate 190 as in FIG. 20. Alternatively, the beam splitter and lamps can be located within the chamber, as in FIG. 1. FIG. 22 shows an in-chamber arrangement based upon FIG. 1 that includes two first lamps 182 and two second lamps 186 arranged such that no beam splitter is needed. As with FIG. 21, additional details are disclosed in FIGS. 1 and 20.

Small-Scale Photolithography System

FIGS. 23A and 23B are diagrams of a small-scale photolithography system that is inexpensive and well-suited for educational and small industrial applications for which the highest spatial resolution (feature size) available is not required. The diagram in the upper portion of FIG. 23 is of a completed, small-scale system that is designed for photolithography with 10 cm×10 cm (4"×4") VUV/UV lamps. Initial tests have been conducted with 172 nm lamps but other wavelengths (such as 147 nm and 222 nm) are also acceptable, depending upon the application. We believe that an experimental system consistent with FIGS. 23A and 23B qualifies as one of the smallest, and perhaps the smallest ever, photolithography system. The system is sized to fit on a small table or a lab desk, and can be held on a hand with a width and depth comparable to a typical paperback book, and a height comparable to a coffee cup. Current dimensions of an experimental system are: Width:depth:height=105 mm×190 mm×115 mm.

FIG. 23A shows details of the exploded assembly, and FIG. 23B is also a diagram of the assembly, but with a sample flood exposure drawer holder 200 shown as being open. Flood exposure (without a mask) is useful for cleaning sample surface and making it hydrophilic The sample flood exposure drawer holder slides (or is mounted upon rollers or bearings) into a flood exposure body 202 that defines a flood processing chamber therein and includes a purge gas fitting 204 that allows for a purge gas such as nitrogen or a rare gas to be admitted to the chamber, or evacuated from the chamber. A window 206 covers most of the main body 208 which defines a lamp/mask/substrate chamber. The main body 208 is preferably constructed from a UV-resistant polymer that can also serve as the material for other components of the assembly. The flood exposure body 202 and the main body 208 include seals (not shown) for sealing the window 206 and all other components that connect to, or are in contact with, the bodies. A first main body cap 210 provides a gas fitting for the lamp chamber, and an opposite second main body cap 212 also provides a gas fitting and supports a flat UV/VUV lamp 214 within the chamber, and emits radiation in both directions (toward flood exposure drawer 200 and in opposite direction upward toward a mask 222). A pair of electrodes 216 extends from the second main body cap 212 and the electrodes are structured to both firmly mount, and make electrical contact to, respective first and second lamp electrodes of the lamp 214. An electrode cap 218 provides electrical contact from an external power source to the pair of electrodes 216. A mask holder body 220 defines a recess for mounting a mask 222, includes an aperture/opening through which VUV/UV radiation passes, and seals a window 224 to the top of the main body 208. The latter also has top and bottom openings/apertures. A sample holder 226 is spring-loaded to a mask holder cap 228 that includes a purge valve. A sample is placed on the mask face down. The sample holder 226 can apply pressure to form a good contact between mask and sample. When a sample is mounted and the chambers includes appropriate gases, mixtures or vacuums, the system operates as described with respect to the FIG. 20 system that is illustrated schematically. If the sample is bulk polymer—no layer is required. If the sample is a semiconductor wafer, then it should be coated with polymer before exposure to the lamp.

Figure 24:
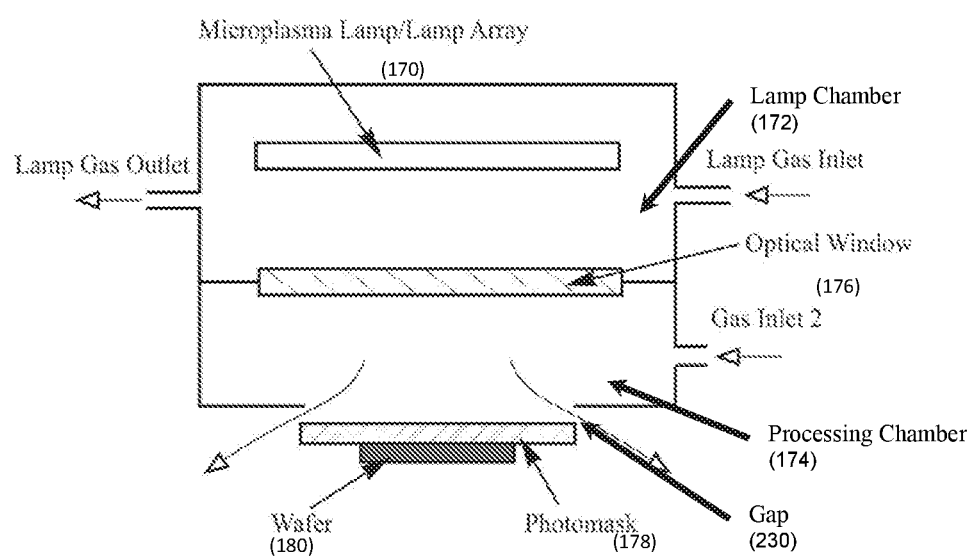
FIG. 24 is a schematic diagram (in cross-section) of a preferred embodiment fabrication tool in which the photomask and wafer (substrate) are in proximity to the lower surface of the system for the purpose of flowing ("showering") the wafer with dry $N_2$ during exposure.

An additional feature is implemented in FIG. 24 to speed the introduction and exposure of a new sample (substrate) to the system. Specifically, it is not necessary to (for example) place a substrate into a vacuum-tight chamber (as in FIG. 20 or FIGS. 23A and 23B). FIG. 24 is labelled with the same reference numbers as FIG. 20. As shown in FIG. 24, it is equally satisfactory in many applications to position a photomask/substrate combination near, but not in vacuum contact with, the bottom surface of the chamber. If $N_2$ is flowed into the processing chamber 174, it will escape into room air by exiting through the small gap 230 (<a few mm) between the wall of the processing chamber 174 and the substrate or substrate holder. Such a system is able to accelerate the photolithography process significantly because it is not necessary to evacuate the room air initially located in the lower chamber of FIGS. 20 and 24. "Showering" the photomask 178 and wafer 180 with dry $N_2$ is inexpensive, does not require a vacuum pumping station, and exhausting nitrogen into room air is safe.

Polymer Microsphere Photoablation

Figure 25:
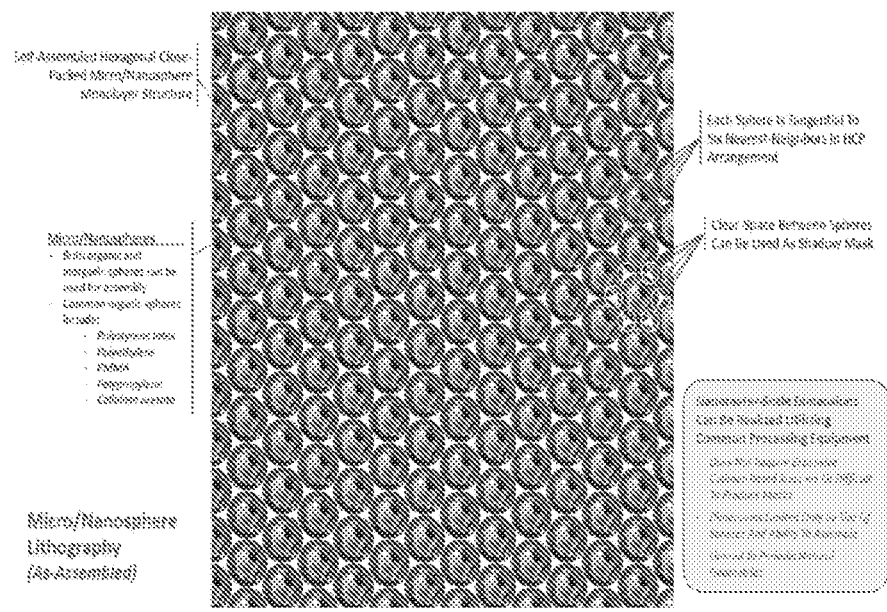
FIGS. 25 and 26 illustrate the effect on polymer microspheres of photoprocessing with a preferred embodiment fabrication tool to shrink microspheres with 172 nm illumination. This "microsphere thinning" process is completely unexpected because 172 nm radiation photoablates the spheres uniformly, despite the fact that the radiation impinges on the array from one direction. That is, the microspheres remain spherical after irradiation.
Figure 26:
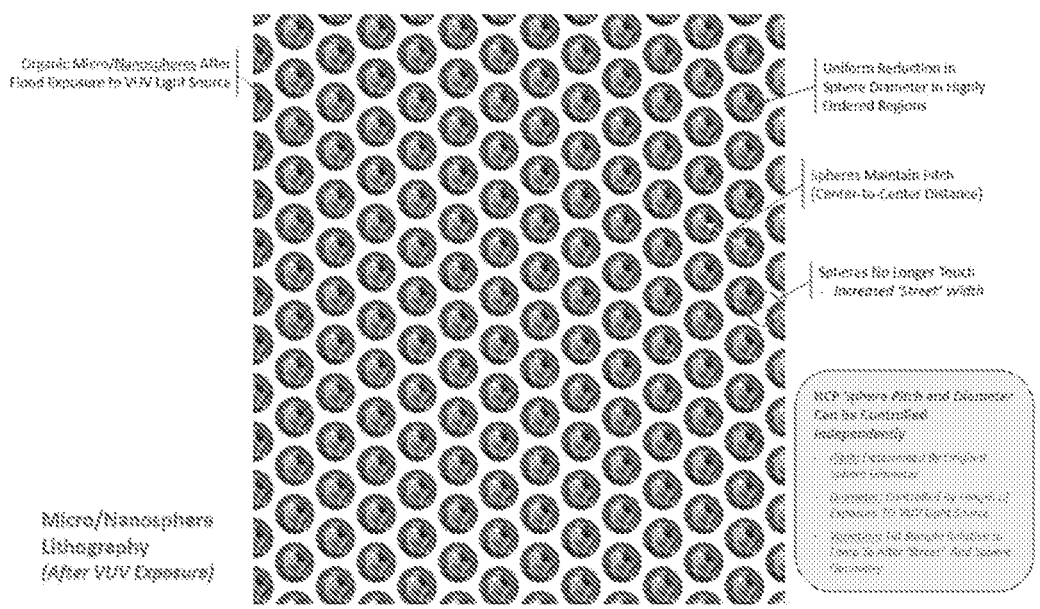

The ability of 172 nm photons, in particular, to ablate polymers opens the door to multiple processes of value to photonics and optoelectronics. For example, FIG. 25 is an optical micrograph of an array of close-packed polyimide spheres lying on a substrate. When this array is irradiated by a 172 nm flat lamp, the microspheres are uniformly reduced in diameter by photoablation. FIG. 26 shows a portion of the same array of FIG. 25, after illumination by the 172 nm lamp. The microspheres no longer touch but now form a two-dimensional array that is of value for micro- or nanosphere lithography, or for optical components including gratings.

Figure 27:
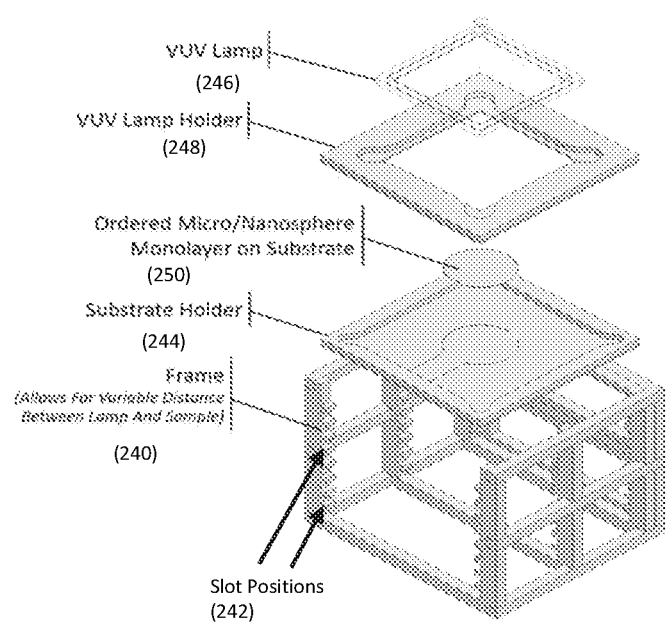
FIG. 27 is an exploded perspective view of a preferred embodiment fabrication tool for VUV or UV photolithography system in which arrays of polymer microspheres are employed to fabricate optical components and systems.

FIG. 27 is a diagram of a preferred system designed for irradiation of the two-dimensional (2D) microsphere crystals, which uses features of FIGS. 1 and 20 as described above but includes mounting options designed specifically for these 2D crystals. The system includes a frame 240 with multiple slot positions 242 that can place a substrate holder 244 at different distances from a UV/VUV lamp 246. The lamp 246 mounts into the recess of a lamp holder 248 that defines an aperture, and lamp first and second electrodes can be contacted from above. The substrate holder 244 includes a recess for mounting a substrate 250 with an ordered nano- or micro-sphere array at any of the positions offered by the slots 242. With this simple design, a VUV and UV photo-lithography system has been demonstrated, and this system employs the "thinning" of polymer microspheres in large arrays so as to obtain optical components and systems such as optical gratings. Combined with a photomask, the system of FIG. 27 can realize optical networks, lenses, arrays of microspheres, and a wide variety of other optical components. As one example, the microsphere 2D grating of FIG. 26 has a reflection spectrum that can be altered ("tuned") by continuing to illuminate the array with 172 nm radiation. That is, the effect of the 172 nm radiation is to reduce the micro- or nano-sphere diameter while increasing the sphere-to-sphere spacing (pitch). Both impact the dependence of reflectivity on wavelength and the wavelength of maximum reflectivity, in particular. Consequently, a desired reflection spectrum can be obtained with the proper duration of 172 nm lamp radiation, the lamp intensity, and initial sphere diameter.

Another comment should be made regarding lamp wavelengths. At the time of this application, flat lamps radiating at 147 nm, 172 nm, 222 nm, 240-260 nm, and 308 nm are available commercially. Additional wavelengths are expected to appear on the market in the next few years. Although 172 nm, for example, has appeared often in this document, it is quite likely that lamps emitting at other nearby wavelengths (165-200 nm, for example) will be equally or more effective for the processes and devices mentioned here, as such lamps are expected to be able to directly ablate a polymer layer. Therefore, 172 nm, 180-200 nm, and 222 nm are currently of particular interest but other wavelengths ranges, such as 160-170 nm and 180-200 nm (under development), are specifically incorporated into any patent application.

Hydrophilic Polymer Surfaces

Experiments have shown that VUV irradiation of a wide range of organic polymers for minimal periods of time renders the surface hydrophilic. Normally, such polymer surfaces are hydrophobic, which is a term indicating that water "beads up" on the surface. Consequently, eyeglasses (for example) constructed from one of several polymers will often quickly "fog" in humid and marine environments. However, it has been found that the irradiation of most organic polymer surfaces for 15 seconds at intensities of 100 mW/cm$^2$ converts the surface from being hydrophobic to hydrophilic. An extensive series of tests has demonstrated that the contact angle for a water droplet on the polymer surface falls dramatically after VUV irradiation. A large contact angle is indicative of a hydrophobic surface whereas a small angle demonstrates that a surface is hydrophilic.

Figure 28A:
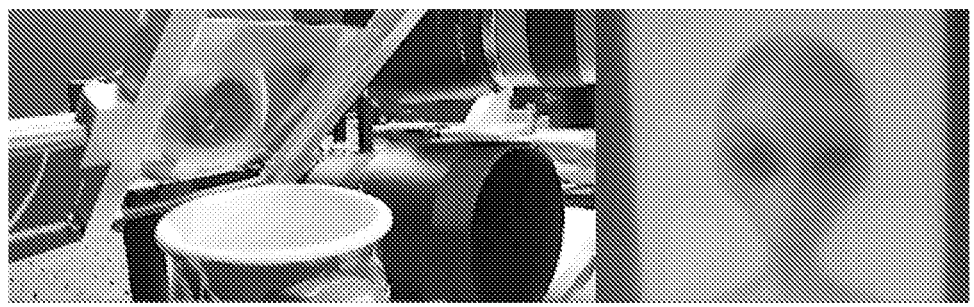
FIGS. 28A and 28B show two photographs of an optical system viewing an image in the presence of water vapor ("fog") from heated water in a cup.
Figure 28B:
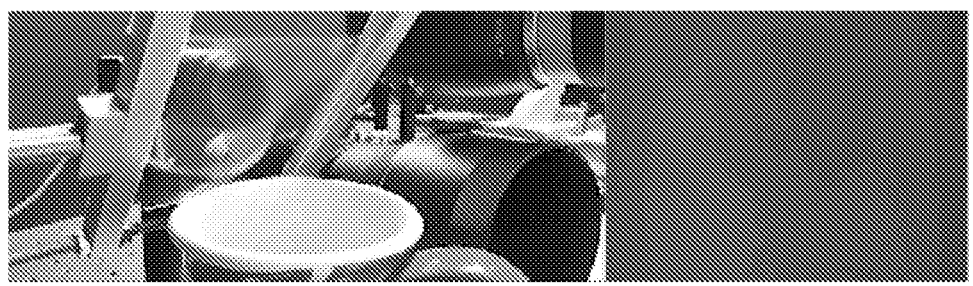

For the fields of optics and fluidics, the implications of the hydrophobic-to-hydrophilic conversion of polymer surfaces that accompanies VUV irradiation of a surface are great. As an example, FIGS. 28A and 28B are photographs of an optical imaging system that includes a polymer film or thin plate. In the photographs at left, the polymer plate is shown oriented at an angle such that the steam from heated water (in the cup at the bottom of the photographs) will impinge on the polymer surface. In FIG. 28A, the outward-looking face of the polymer plate has been irradiated by a 172 nm lamp at an intensity of 15 mW/cm$^2$ for 60 seconds. In this instance, the polymer surface is hydrophilic and the steam arriving at the surface is dispersed into a thin film of uniform thickness. Consequently, the optical system performance is unaffected, and the image at upper right is observed, despite exposure of the polymer surface to the steam for a prolonged period of time.

FIG. 28B shows the same imaging system and test arrangement except that the polymer plate has not been irradiated by the VUV lamp. In this case, the steam arriving at the polymer plate forms a myriad of (arrays of micro-water droplets that severely scatter incoming visible light. Accordingly, the imaging system is now unable to detect the image, as shown at lower right of FIG. 28B.

Extensive tests confirm the results of FIGS. 28A and 28B and, consequently, eyeglasses, goggles, and other eyewear can now be made that do not "fog" in humid or marine environments. Such eyewear can consist of lenses fabricated from the proper polymer, or they may be fabricated from glass or other optical material and simply overcoated with a thin polymer film. Furthermore, camera lenses can also be overcoated with a polymer film that is treated by VUV irradiation, thereby rendering them less susceptible to fogging. This simple alteration in the design of optical components such as windows and lenses is expected to result in substantial improvements in optical system performance in nautical environments or exceptionally humid locales. Also, car and truck windshields can be overcoated with a thin layer of polymer that, when treated with VUV irradiation, will be hydrophilic and therefore resist the beading of water droplets. This treatment is expected to substantially improve the visibility of motorists in the presence of rain. This hydrophobic-to-hydrophilic conversion is also expected to improve the flow of water through channels, and microchannels, in particular. Because a hydrophilic surface forms a thin layer of water at the surface, a stream of water in contact with this surface layer is expected to move with less turbulence than would normally be the case for a hydrophobic surface over which water is flowing. Consequently, polymer microchannels in biomedical devices, such as microfluidic arrays, can be irradiated by a VUV lamp for a minimum of 30 seconds and have their flow characteristics changed. Also, the VUV-induced hydrophobic-to-hydrophilic conversion of polymer surfaces can be accomplished on a roll-to-roll basis as described earlier.

In a manner similar to that described above, producing hydrophilic surfaces on metals and fiberglass, for example, is expected to reduce drag on moving underwater surfaces or the hulls of marine vehicles.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A photolithography method, the method comprising:
providing an organic polymer;
placing the organic polymer in a chamber;
evacuating the chamber using a vacuum system to create a vacuum in the chamber or evacuating the chamber using the vacuum system to create a vacuum in the chamber and then providing an inert gas flow in the chamber or a static pressure of up to one atmosphere of inert gas in the chamber;

providing at least one mask in a desired pattern to be created in the organic polymer;

generating photons with a microplasma array flat lamp photon source; and directing the photons through the mask to non-thermally photoablate the desired pattern in the organic polymer, or to photochemically alter portions of the organic polymer for removal by a solvent followed by removal of the portions to form the desired pattern in the organic polymer.

2. The method of claim 1, wherein the organic polymer comprises a polymer sample to be patterned.

3. The method of claim 1, wherein the organic polymer comprises a layer on a material substrate.

4. The method of claim 3, wherein the organic polymer comprises a thin polymer film of poly(methyl-methacrylate)), another acrylic, CR 39, ABS, PET, or other polymer material such as a polycarbonate.

5. The method of claim 1, wherein the microplasma flat lamp photon source comprises a lamp generating photons having wavelengths of approximately 126 nm, 147 nm, 172 nm, or in the 160-170 nm or 180-200 nm wavelength ranges.

6. The method of claim 1, conducted in a single chamber at vacuum or with an inert $N_2$ or rare gas flow through the chamber, or a static pressure of one atmosphere of $N_2$ or rare gas in the chamber.

7. The method of claim 1, wherein the organic polymer comprises a layer on a material substrate, the method further comprising:

introducing deposition molecular precursors into a chamber containing the material substrate with the patterned thin film thereupon; and breaking bonds in the precursors with photons from the microplasma array flat lamp photon source to deposit a product of the precursors in the desired pattern on the material substrate.

8. The method of claim 7, conducted in a single chamber at vacuum or with an inert such as $N_2$ or a rare gas flow through the chamber, or a static pressure of one atmosphere of $N_2$ or rare gas in the chamber.

9. The method of claim 7, wherein the layer comprises Poly(methyl methacrylate)), another acrylic, CR 39, ABS, PET, or other organic material such as a polycarbonate.

10. The method of claim 1, wherein the microplasma flat lamp photon source comprises a lamp generating 172 nm photons and the method comprises generating photons with a second microplasma array flat lamp photon source emitting a wavelength different from that of the first photon source and emitting predominantly at 126 nm, 147 nm, 160-170 nm, 172 nm, 180-200 nm, 222 nm, 240-260 nm, and/or 308 nm.

11. The method of claim 1, wherein the organic polymer comprises a layer on a material substrate, the method conducted in a chamber not at vacuum but rather allowing for continuous gas flow into the chamber and over a mask proximate to the surface of the material substrate.

12. The method of claim 1, wherein the organic polymer comprises a layer on a material substrate, the method further comprising etching of the layer and/or the material substrate in an additional step using the mask or switching to a second mask, and providing a gas or gas mixture, such as a mixture of $CCl_4$ vapor and a rare gas such as Ar, to etch the material substrate.

13. The method of claim 1, further comprising transferring a pattern formed in the organic polymer to another material.

14. The method of claim 13, wherein the another material comprises a metal or a ceramic, and the method further comprises removal of the organic polymer after the metal or ceramic has been formed in the pattern.

15. The method of claim 1, wherein the organic polymer comprises a roll-to-roll material that is moved past the mask.

16. The method of claim 1, further comprising changing the orientation of the at least one mask or providing a second mask and then repeating the generating and directing to add complexity to the pattern.

17. The method of claim 1, further comprising loading the organic polymer into an e-beam lithography tool and adding smaller features to the pattern via e-beam lithography.

18. The method of claim 1, wherein the microplasma flat lamp photon source has an intensity of at least 15 $mW/cm^2$.

19. The method of claim 1, comprising controlling a rate that the photons non-thermally ablate the desired pattern in the organic polymer by an exposure time of the directing and/or an intensity of the microplasma flat lamp photon source.

20. The method of claim 1, wherein the vacuum system comprises a turbomolecular pump and the evacuating removes $O_2$ from the chamber to a level that prevents interaction of the photons with $O_2$ to create $O_3$.

* * * * *